United States Patent
Toyonaka et al.

(10) Patent No.: US 10,393,972 B2
(45) Date of Patent: Aug. 27, 2019

(54) OPTICAL SUBASSEMBLY AND OPTICAL MODULE

(71) Applicant: Oclaro Japan, Inc., Sagamihara, Kanagawa (JP)

(72) Inventors: Takashi Toyonaka, Kanagawa (JP); Hiroshi Hamada, Kanagawa (JP)

(73) Assignee: Lumentum Japan, Inc., Kanagawa (JP)

( * ) Notice: Subject to any disclaimer, the term of this patent is extended or adjusted under 35 U.S.C. 154(b) by 142 days.

(21) Appl. No.: 15/715,498

(22) Filed: Sep. 26, 2017

(65) Prior Publication Data
US 2018/0088293 A1    Mar. 29, 2018

(30) Foreign Application Priority Data

Sep. 27, 2016 (JP) .................................. 2016-188372

(51) Int. Cl.
*G02B 6/42* (2006.01)
*H01L 31/02* (2006.01)
(Continued)

(52) U.S. Cl.
CPC ......... *G02B 6/4279* (2013.01); *G02B 6/4249* (2013.01); *H01L 31/02005* (2013.01);
(Continued)

(58) Field of Classification Search
CPC .... G02B 6/4279; G02B 6/4249; G02B 6/428; H01L 31/10; H01L 31/02005; H01L 27/1443; H04B 10/691
(Continued)

(56) References Cited

U.S. PATENT DOCUMENTS

| 8,693,879 | B2 * | 4/2014 | Douma ................ G02B 6/4246 250/214 A |
| 8,774,568 | B2 * | 7/2014 | Han ..................... G02B 6/4206 385/14 |
| 2012/0292731 | A1 | 11/2012 | Toyonaka et al. | |

FOREIGN PATENT DOCUMENTS

| JP | 2012-256853 A | 12/2012 |
| JP | 2013-038216 A | 2/2013 |

OTHER PUBLICATIONS

Masahiro Ebisu, et at., "Highly uniform performance of 25Gbit/s 4 channel lens integrated PD array", C-4-12, General Conference of Institute of Electronics, Information and Communication Engineers, 2015.

* cited by examiner

*Primary Examiner* — Seung C Sohn
(74) *Attorney, Agent, or Firm* — Mattingly & Malur, PC

(57) ABSTRACT

The optical subassembly includes a photodetector including element terminal groups for light-receiving elements, and an electric signal controller including IC terminal groups, wherein any one of the element terminal group and the IC terminal group has a two-terminal configuration, and the other one has a three-terminal configuration, wherein, in a case where terminal groups at both ends where center positions thereof are disposed on the inner side together and have the two-terminal configuration, the first connection terminals are disposed on the outer side than a second connection terminals in the two-terminal configuration, and in a case where terminal groups at both ends where center positions thereof are on the outer side together and have the two-terminal configuration, a first connection terminal in the two-terminal configuration is disposed on the inner side than the second connection terminal.

7 Claims, 17 Drawing Sheets

(51) Int. Cl.
*H04B 10/69* (2013.01)
*H01L 31/10* (2006.01)
*H01L 27/144* (2006.01)

(52) U.S. Cl.
CPC ........... *H01L 31/10* (2013.01); *H04B 10/691* (2013.01); *G02B 6/428* (2013.01); *H01L 27/1443* (2013.01)

(58) Field of Classification Search
USPC ...................................................... 250/208.6
See application file for complete search history.

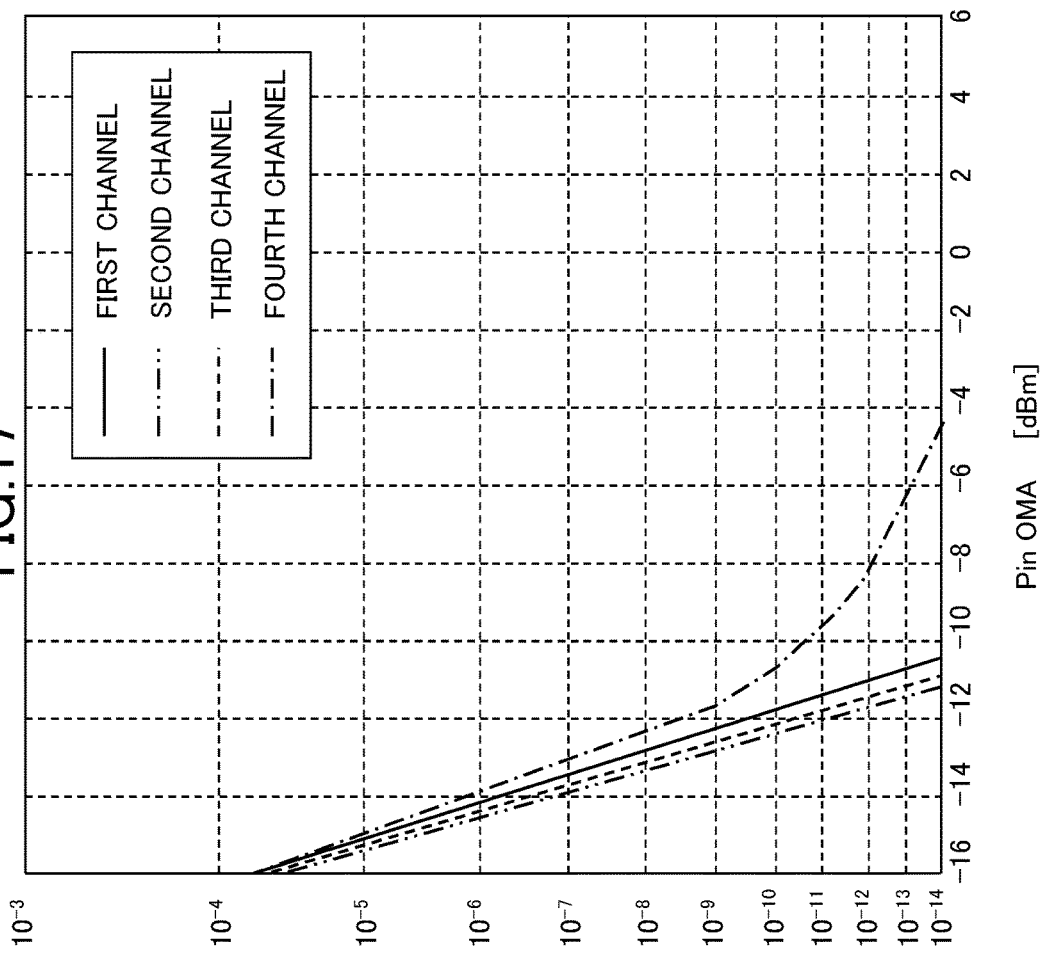

OPTICAL SUBASSEMBLY AND OPTICAL MODULE

CROSS-REFERENCE TO RELATED APPLICATION

The present application claims priority from Japanese application JP 2016-188372, filed on Sep. 27, 2016, the content of which is hereby incorporated by reference into this application.

BACKGROUND OF THE INVENTION

1. Field of the Invention

The present invention relates to an optical subassembly and an optical module on which the optical subassembly is disposed.

2. Description of the Related Art

An optical module provided with one or a plurality of optical subassemblies having a function of the optical transmitting and/or a function of the optical receiving on the inside thereof, is used for optical communication. In recent years, an array type optical receiver module provided with a plurality of photo diodes has been used as an optical receiving subassembly accommodated in an optical module. For example, the optical receiving subassembly provided with the array type optical receiver module provided with four photo diodes will be described hereinafter. FIG. 13 is a partial exploded perspective view of an optical receiving subassembly 200 accommodated in the optical module according to the technology of the related art. An array type optical receiver module 201 provided in the optical receiving subassembly 200 illustrated in FIG. 13 is a four-channel array type optical receiver module including a photo diode array 202 provided with four photo diodes 211 (refer to FIG. 14), and a carrier 203 which holds the photo diode array 202. On a rear surface of a semiconductor substrate of the photo diode array 202, a light receiving window 205 is provided. Four light receiving windows 205 are illustrated as light receiving windows 205a, 205b, 205c, and 205d, in order from the right side of FIG. 13. The photo diode array 202 receives signal light incident on the light receiving window 205 and converts the signal light into an electric signal. The electric signal is amplified by an IC chip 400 via an electric signal controller 300, and is detected as a photocurrent. Optical receiving channel numbers are a first channel, a second channel, a third channel, and a fourth channel, in order from the right side of FIG. 13. Here, the electric signal controller 300 is an integrated circuit provided with the IC chip 400 having an amplifying function on the inside thereof.

FIG. 14 is a perspective view of the photo diode array 202 according to the technology of the related art viewed from a side opposite to the side on which the light receiving window is formed. On a semi-insulating Fe-doped InP substrate 219, in order from the left side of FIG. 14, a first photo diode 211a, a second photo diode 211b, a third photo diode 211c, and a fourth photo diode 211d are formed. In the four photo diodes 211, a first conductive type electrode mesa portion 314 and first conductive type electrodes 316, and a second conductive type electrode mesa portion 315 and second conductive type electrodes 317 in each of the photo diodes 211, are disposed in the same orientation, in the same direction as the direction in which each of the photo diodes 211 is arranged. In each of light receiving mesa portions 312a, 312b, 312c, and 312d, an interval of center portions adjacent to each other is, for example, 0.5 mm, and it is possible to receive the light incident from the rear surface side of the semi-insulating Fe-doped InP substrate 219 being respectively independent.

FIG. 15 is an upper view of the optical receiving subassembly according to the technology of the related art illustrated in FIG. 13. On the carrier 203, four element terminal groups 324 configured of first conductive type first connection terminals 306 (306a, 306b, 306c, and 306d) and second conductive type second connection terminals 307 (307a, 307b, 307c, and 307d), are provided, and the photo diode array 202 is fixed to the carrier 203 as first conductive type electrodes (for example, P-type electrodes) 316a, 316b, 316c, and 316d are connected and fixed to the first connection terminals 306a, 306b, 306c, and 306d of the carrier 203, and second conductive type electrodes (for example, N-type electrodes) 317a, 317b, 317c, and 317d are connected and fixed to the second connection terminals 307a, 307b, 307c, and 307d of the carrier 203, respectively. The electric signal controller 300 includes IC terminal groups 370 which are four three-terminal type input terminals configured of first conductive type third connection terminals 308 (308a, 308b, 308c, and 308d) and second conductive type fourth connection terminals 309 (309a, 309b, 309c, and 309d) installed on both sides of each of the third connection terminals. A pitch of the third connection terminals 308a, 308b, 308c, and 308d is, for example, 0.75 mm. The first conductive type electrodes 316a, 316b, 316c, and 316d and the second conductive type electrodes 317a, 317b, 317c, and 317d in each of the photo diodes 211 of the photo diode array 202, are electrically connected to the third connection terminals 308a, 308b, 308c, and 308d and the fourth connection terminals 309a, 309b, 309c, and 309d in the electric signal controller 300. In addition, the first connection terminals 306a, 306b, 306c, and 306d are electrically connected to the third connection terminals 308a, 308b, 308c, and 308d, and the second connection terminals 307a, 307b, 307c, and 307d are electrically connected to the fourth connection terminals 309a, 309b, 309c, and 309d, by a GSG-type wire connection via wires 500. Here, the first connection terminal 306a and the third connection terminal 308a are connected to each other via a wire 500a, the first connection terminal 306b and the third connection terminal 308b are connected to each other via a wire 500b, the first connection terminal 306c and the third connection terminal 308c are connected to each other via a wire 500c, and the first connection terminal 306d and the third connection terminal 308d are connected to each other via a wire 500d. According to this, the signal light input into the light receiving windows 205a, 205b, 205c, and 205d, is independent, is converted into an electric signal, is amplified by the IC chip 400 via the electric signal controller 300, and can be detected as a photocurrent.

SUMMARY OF THE INVENTION

In order to obtain excellent frequency response characteristics in an array type optical receiver module 201 provided with a plurality of photo diodes 211, it is necessary to reduce inductance to an IC chip 400 of all of the channels.

FIG. 16 is a view illustrating the frequency response characteristics of each of the channels of an optical receiving subassembly 200 according to the technology of the related art. As illustrated in FIG. 16, in the first channel and the fourth channel, peaking becomes higher in the vicinity of 15 to 20 GHz compared to those of the second channel and the third channel. In particular, the peaking of the fourth channel is the highest compared to that of the other channels, and a 3 dB cutoff frequency is approximately 22 GHz, and deteriorates by 3 GHz or more compared to that of the other channels. FIG. 17 is a view illustrating receiver sensitivity characteristics at 25 Gbps of each of the channels according to the technology of the related art. As illustrated in FIG. 17, since the fourth channel has a high peaking and low 3 dB cutoff frequency, a floor is generated in the receiver sensitivity characteristics.

Here, through the investigation by the inventors, it was ascertained that, in the optical receiving subassembly 200 according to the technology of the related art, deterioration of the characteristics of the fourth channel is caused by the length of a wire 500d in the fourth channel to be longer than a wire 500a in the first channel, a wire 500b in the second channel, and a wire 500c in the third channel. Specifically, it is considered that inductance in the fourth channel increases and the frequency response characteristics deteriorate as the wire 500d in the fourth channel is longer than the wires 500a to 500c. In addition, an example of disposition of the electrodes and the wires according to the technology of the related art is described in JP2012-256853A, JP2013-038216A, and C-4-12, General Conference of Institute of Electronics, Information and Communication Engineers, 2015.

Based on the knowledge of the inventors, in order to solve the above-described problems, the invention is to further shorten the length of a wire of a channel in which the length of the wire becomes the longest among the wires to be used in connecting each of a plurality of channels, in an optical subassembly including the plurality of channels. More specifically, the invention is to reduce a difference in length of the wires between the plurality of channels.

(1) According to an aspect of the invention, there is provided an optical subassembly including: a photodetector including a plurality of light-receiving elements and a plurality of element terminal groups which are respectively electrically connected to the plurality of light-receiving elements and are disposed to be aligned in order along a first direction; and an electric signal controller including a plurality of IC terminal groups which are electrically connected to the plurality of element terminal groups and are disposed to be aligned in order along the first direction, wherein the plurality of element terminal groups face the plurality of IC terminal groups while being separated from each other, wherein any one of the element terminal group and the IC terminal group has a two-terminal configuration in which a first conductive type first connection terminal and a second conductive type second connection terminal are respectively disposed to be aligned along the first direction, wherein the other one of the element terminal group and the IC terminal group has a three-terminal configuration in which a first conductive type third connection terminal and two second conductive type fourth connection terminals are disposed to be aligned along the first direction in order of one of the fourth connection terminals, the third connection terminal, and the other one of the fourth connection terminals, wherein each of the first connection terminals is electrically connected to the corresponding third connection terminal via a wire, and each of the second connection terminals is electrically connected to corresponding two fourth connection terminals via the wire, wherein, in the first direction, center positions of the element terminal groups at both ends among the plurality of element terminal groups are located together on the inner or outer side with respect to center positions of the IC terminal groups at both ends among the plurality of IC terminal groups, and wherein, in a case where the center positions of the terminal groups at both ends that are either terminal groups of the element terminal groups at both ends or the IC terminal groups at both ends and have the two-terminal configuration are located together on the inner side with respect to the center positions of the terminal groups at both ends that are the other terminal groups of the element terminal groups at both ends or the IC terminal groups at both ends, the first connection terminals at both ends are disposed on the outer side with respect to the second connection terminals at both ends, in a case where the center positions of the terminal groups at both ends that are either terminal groups of the element terminal groups at both ends or the IC terminal groups at both ends and have the two-terminal configuration are located together on the outer side with respect to the center positions of the terminal groups at both ends that are the other terminal groups of the element terminal groups at both ends or the IC terminal groups at both ends, the first connection terminals at both ends are disposed on the inner side with respect to the second connection terminals at both ends.

(2) In the optical subassembly according to the above-described (1), wherein, in a case where the center positions of the terminal groups at both ends that are either terminal groups of the element terminal groups at both ends or the IC terminal groups at both ends and have the two-terminal configuration are located together on the inner side with respect to the center positions of the terminal groups at both ends that are the other terminal groups of the element terminal groups at both ends or the IC terminal groups at both ends, a plurality sets of the first connection terminal and the second connection terminal are repeatedly disposed in order from both ends, in a case where the center positions of the terminal groups at both ends that are either terminal groups of the element terminal groups at both ends or the IC terminal groups at both ends and have the two-terminal configuration are located together on the outer side with respect to the center positions of the terminal groups at both ends that are the other terminal groups of the element terminal groups at both ends or the IC terminal groups at both ends, a plurality sets of the second connection terminal and the first connection terminal are repeatedly disposed in order from both ends.

(3) In the optical subassembly according to the above-described (1) or (2), the photodetector may further include a carrier having an upper surface on which the plurality of element terminal groups are disposed and a front surface on which the plurality of light-receiving elements are disposed, each of the light-receiving elements may include a first conductive type electrode and a second conductive type electrode, on the front surface of the carrier, the plurality of light-receiving elements may be disposed to be aligned in a first direction, and the first conductive type electrode and the second conductive type electrode in each of the light-receiving elements may be disposed to be aligned in a direction intersecting the first direction on the front surface of the carrier, and on the front surface of the carrier, a first connection wiring for electrically connecting the first conductive type electrode and the first connection terminal to each other, and a second connection wiring for electrically connecting the second conductive type electrode and the second connection terminal to each other, may be disposed.

(4) In the optical subassembly according to any of the above-described (1) to (3), an IC chip which is electrically connected to the electric signal controller may further be provided.

(5) In the optical subassembly according to the above-described (4), the photodetector may be an array type optical receiver module on which a plurality of photo diodes are disposed, and the IC chip may be provided with a preamplifier circuit which amplifies an electric signal output from each of the photo diodes.

(6) In the optical subassembly according to any of the above-described (1) to (3), the photodetector may be an array type semiconductor laser device.

(7) According to another aspect of the invention, there is provided an optical module including: the optical subassembly according to any of the above-described (1) to (5); a circuit board; and a case including the optical subassembly and the circuit board.

According to the present invention, in the optical subassembly including a plurality of channels, it is possible to further shorten the length of the wire of the channel at which the length of the wire becomes the longest among the wires used in connecting each of the plurality of channels to each other. Furthermore, it is possible to reduce a difference in length of the wires between the plurality of channels.

BRIEF DESCRIPTION OF THE DRAWINGS

FIG. 17 is a view illustrating receiver sensitivity characteristics at 25 Gbps of each of the channels according to the technology of the related art.

DETAILED DESCRIPTION OF THE INVENTION

Figure 1:
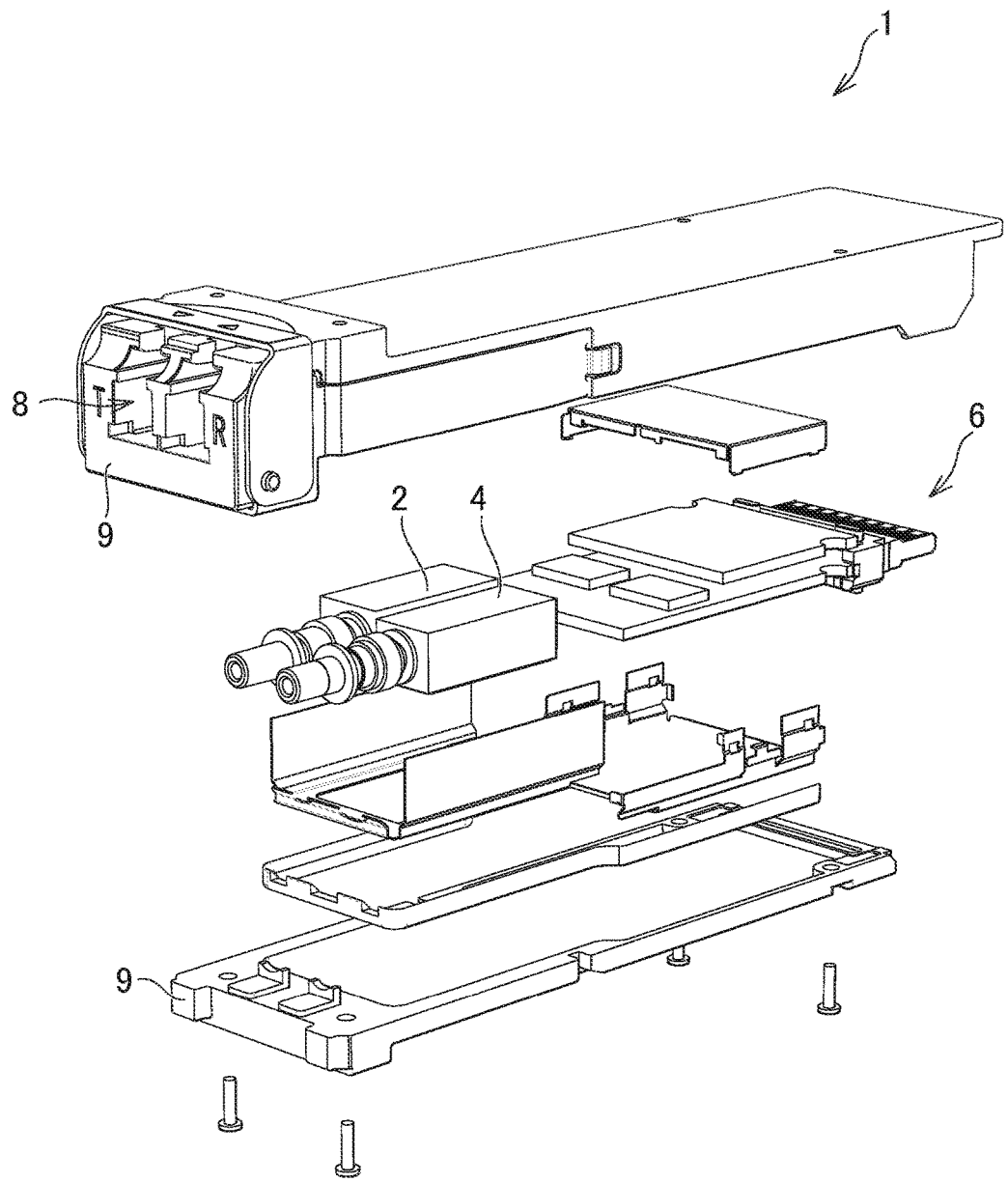
FIG. 1 is an exploded perspective view of an optical module according to a first embodiment.

Hereinafter, the embodiments of the present invention will be described with reference to the drawings. In addition, in the drawings, the same or equivalent elements will be given the same reference numerals, and the overlapping descriptions will be omitted.

First Embodiment

FIG. 1 is an exploded perspective view of an optical module 1 according to a first embodiment. The optical module 1 has two optical subassemblies embedded therein. Specifically, the optical module 1 includes an optical transmitting subassembly 2 (transmitter optical subassembly (TOSA)) for converting an electric signal into an optical signal, and an optical receiving subassembly 4 (receiver optical subassembly (ROSA)) for converting the optical signal into the electric signal. On the optical transmitting side, the electric signal transmitted by a host substrate which is not illustrated passes through an electric interface 6, passes through a circuit board in the optical module 1, is converted into an optical signal, and is transmitted from an optical interface 8. On the optical receiving side, the optical signal is received, and the electric signal is output to a host side substrate which is not illustrated. The optical module 1 includes a case 9 configured of one pair of half cases, and has an electronic component accommodated on the inside thereof.

Figure 2:
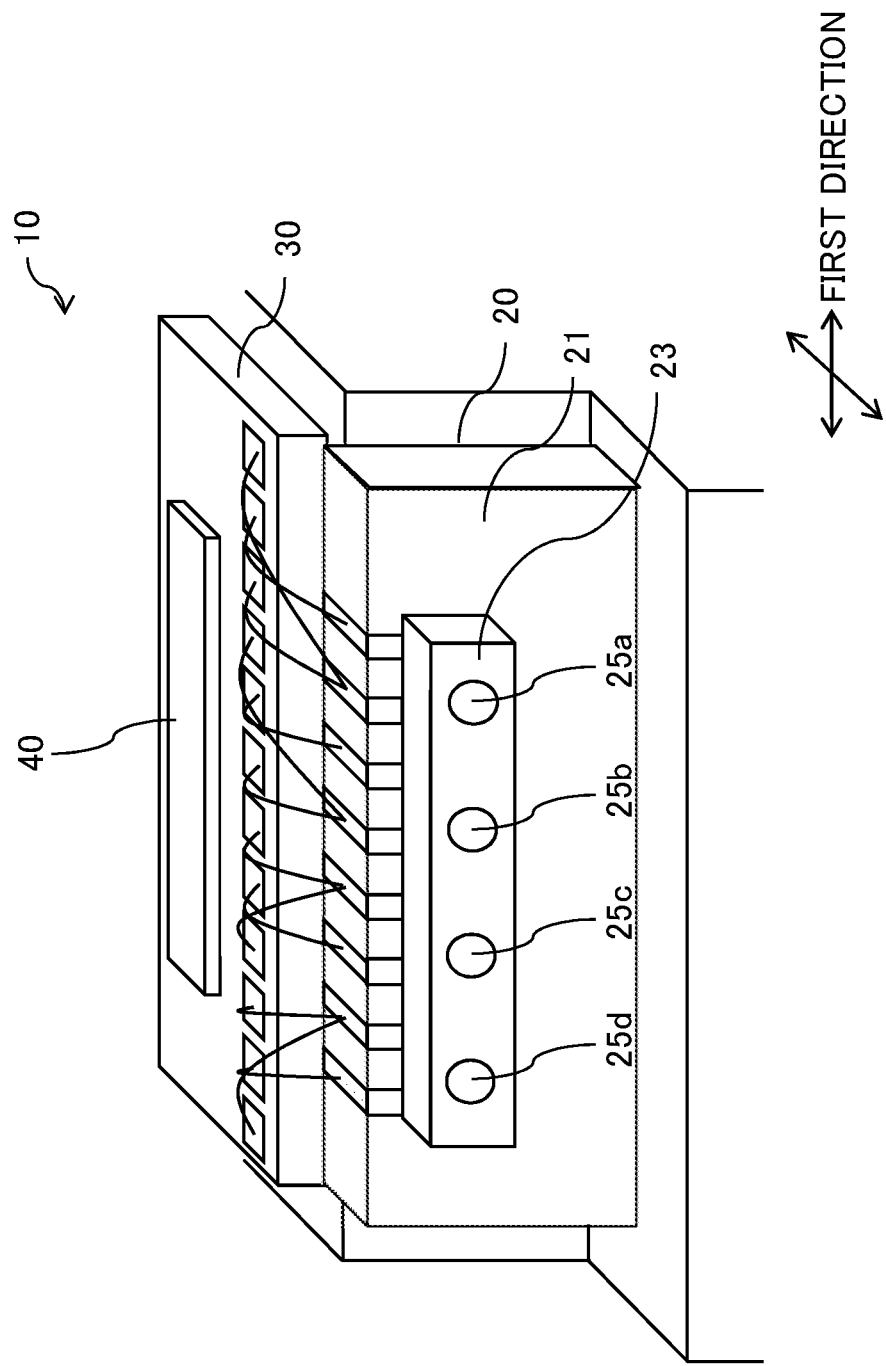
FIG. 2 is a partial exploded perspective view of an optical receiving subassembly accommodated in the optical module illustrated in FIG. 1.

FIG. 2 is a partial exploded perspective view of an optical receiving subassembly 10 accommodated in the optical module 1 illustrated in FIG. 1.

The optical receiving subassembly 10 is configured to include a photodetector 20, an electric signal controller 30, and an IC chip 40.

The photodetector 20 includes a carrier 21, a photo diode array 23 in a plurality of channels on which a plurality of light-receiving elements (here, photo diode 22) are disposed, and a plurality of element terminal groups 24 (refer to FIG. 4) which are electrically connected to each of the plurality of photo diodes 22 (refer to FIG. 3) and are disposed to be aligned in order along a first direction. Here, the first direction is a leftward-and-rightward direction of FIG. 2. On an upper surface of the carrier 21, the plurality of element terminal groups 24 are formed, and on a front surface of the carrier 21, the photo diode array 23 is disposed. The photo diode array 23 illustrated in FIG. 2 indicates the photo diode array 23 in four channels in which four photo diodes 22 are formed to be aligned on the front surface of the semiconductor substrate. On the rear surface of the semiconductor substrate of the photo diode array 23, a light receiving window 25 is provided. Four light receiving windows 25 are illustrated as light receiving windows 25a, 25b, 25c, and 25d in order from a right side of FIG. 2. The photo diode array 23 receives the light signal incident on the light receiving window 25 and converts the optical signal into the electric signal. Here, the optical receiving channel numbers are a first channel, a second channel, a third channel, and a fourth channel, in order from the right side of FIG. 2.

Figure 3:
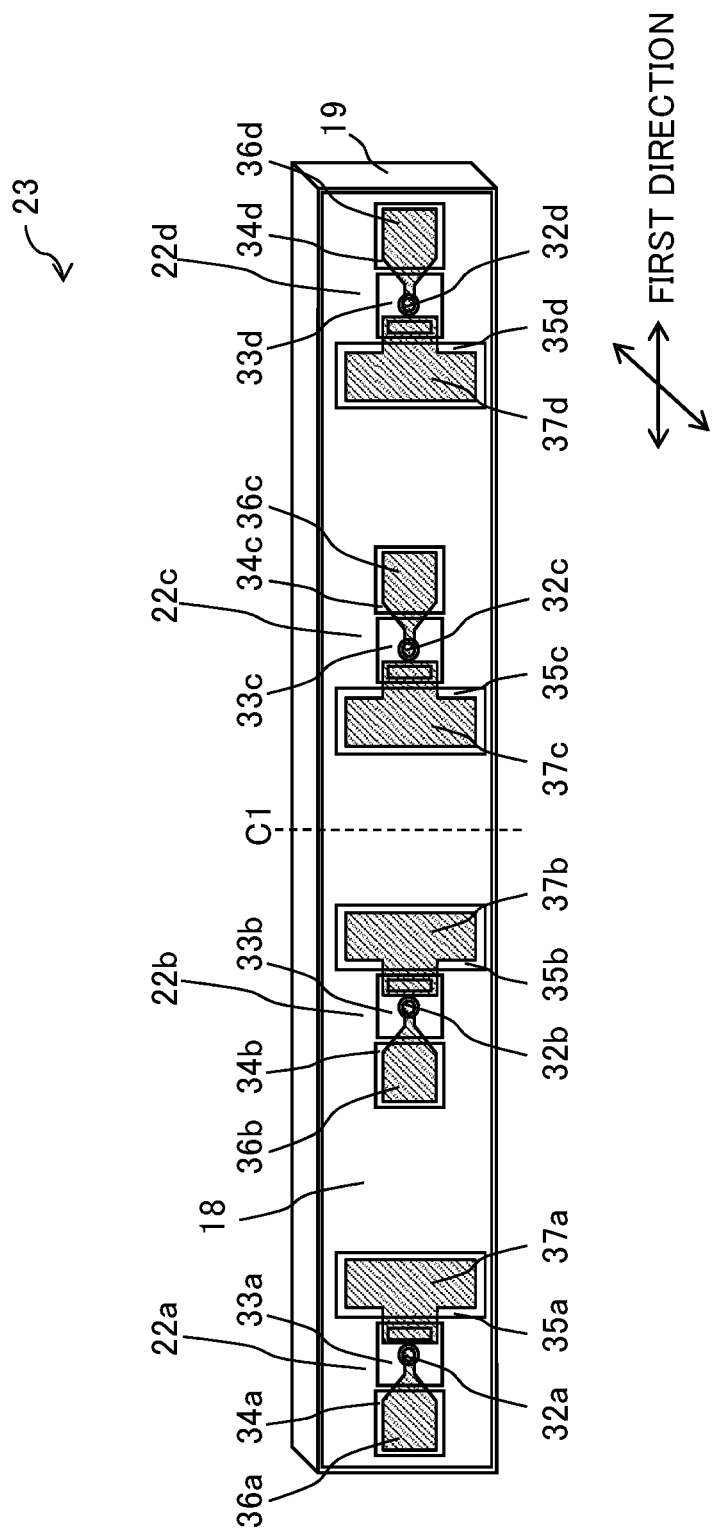
FIG. 3 is a perspective view of a photo diode array according to the first embodiment viewed from a front surface side.

FIG. 3 is a perspective view of the photo diode array 23 according to the first embodiment viewed from the front surface side. In the photo diode array 23, on a semi-insulating Fe-doped InP substrate 19, in order from the left side, a first photo diode 22a, a second photo diode 22b, a third photo diode 22c, and a fourth photo diode 22d, are formed. The first photo diode 22a is provided with an n-type InP contact layer 33a formed on the semi-insulating Fe-doped InP substrate 19, and a light receiving mesa portion 32a which is formed on the upper portion thereof and includes a PN bonding portion that can receive the optical signal incident from the rear surface side of the Fe-doped InP substrate 19. The light receiving mesa portion 32a has a multilayered structure in which a p-type InGaAs contact layer, a p-type InGaAlAs buffer layer, an n-type InGaAs light absorbing layer, and an n-type InGaAlAs buffer layer are stacked when viewed from a top portion side. The entire front surface of the Fe-doped InP substrate 19 is coated by an insulating protective film 18, but an opening portion is provided by a circular pattern on the upper surface of the light receiving mesa portion 32a or by a rectangular pattern at a part of the n-type InP contact layer 33a. In the periphery of the light receiving mesa portion 32a, a first conductive type electrode mesa portion 34a and a second conductive type electrode mesa portion 35a are formed, and the heights thereof are the same as the height of the light receiving mesa portion 32a or higher than the height of the light receiving mesa portion 32a. A first conductive type electrode 36a (for example, p-type electrode) which is electrically connected to the p-type InGaAs contact layer which is in the top portion of the light receiving mesa portion 32a via the opening portion is drawn out to an upper surface of the first conductive type electrode mesa portion 34a. In addition, a second conductive type electrode 37a (for example, n-type electrode) which is electrically connected to the n-type InP contact layer 33a via the opening portion is drawn out to an upper surface of the second conductive type electrode mesa portion 35a. In addition, the second photo diode 22b to fourth photo diode 22d have a configuration similar to that of the above-described first photo diode 22a. Here, the first photo diode 22a, the second photo diode 22b, the third photo diode 22c, and the fourth photo diode 22d are disposed to be symmetric to a center line C1 (center line in the first direction which is a direction in which each of the photo diodes 22 is arranged) of the photo diode array 23. In other words, first conductive type electrodes 36 of each of the photo diodes 22 are disposed further on the outer side than a second conductive type electrode 37 with respect to the center line C1 of the photo diode array 23. In other words, the first conductive type electrode 36 and the second conductive type electrode 37 are disposed in order toward the inner side (center line C1) of the photo diode array 23 from each of the two ends in the first direction of the photo diode array 23.

Figure 4:
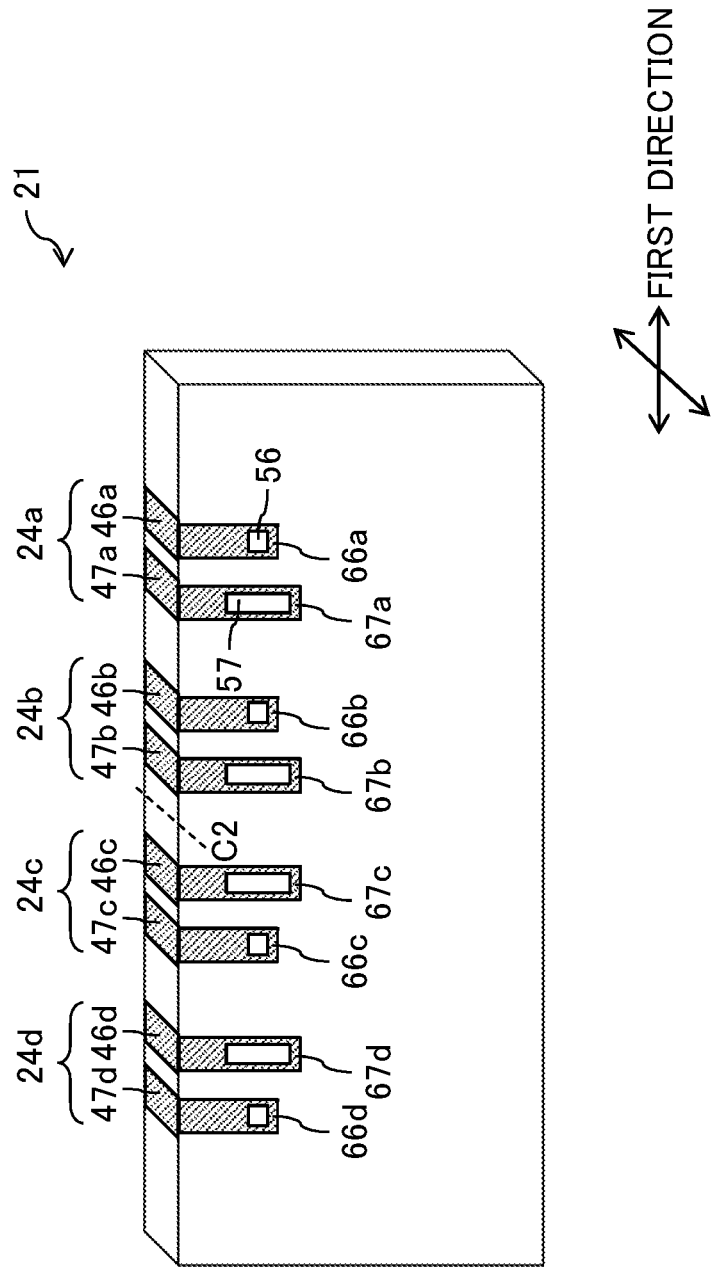
FIG. 4 is a perspective view of a carrier according to the first embodiment viewed from a front surface side.

FIG. 4 is a perspective view of the carrier 21 according to the first embodiment viewed from the front surface side. In the carrier 21, in order from the right side, an element terminal group 24a connected to the first photo diode 22a, an element terminal group 24b connected to the second photo diode 22b, an element terminal group 24c connected to the third photo diode 22c, and an element terminal group 24d connected to the fourth photo diode 22d, are formed. The element terminal group 24a has a two-terminal configuration configured of a first conductive type first connection terminal 46a and a second conductive type second connection terminal 47a. The first connection terminal 46a is formed on the upper surface of the carrier 21. Similarly, the second connection terminal 47a is formed on the upper surface of the carrier 21. In addition, the upper surface of the carrier 21 has a rectangular shape, and the first direction is a longitudinal direction of the rectangular shape. The element terminal group 24b to element terminal group 24d also have a configuration similar to that of the element terminal group 24a. Here, on the upper surface of the carrier 21, each of the element terminal groups 24 is disposed symmetrically to a center line C2 (center line in the first direction which is the direction in which the element terminal groups 24 are arranged) of the carrier 21. In other words, first connection terminals 46 of each of the element terminal groups 24 are disposed further on the outer side than a second connection terminal 47 with respect to the center line C2 of the carrier 21. In other words, toward the inner side (center line C2) of the carrier 21 from each of the two ends in the first direction of the carrier 21, the plurality of two-terminal configurations in which the first connection terminal 46a and the second connection terminal 47a are disposed in order are repeated. In addition, on the front surface of the carrier 21, first connection wirings 66 (66a to 66d) for electrically connecting the first conductive type electrode 36 and the first connection terminal 46 to each other, and second connection wirings 67 (67a to 67d) for electrically connecting the second conductive type electrode 37 and the second connection terminal 47 to each other are formed. The first connection wiring 66 and the second connection wiring 67 linearly extend toward the upper surface of the carrier 21 respectively from the first conductive type electrode 36 and the second conductive type electrode 37 on the front surface of the carrier 21, and reach the first connection terminal 46 and the second connection terminal 47.

At a part of the first connection wiring 66 and the second connection wiring 67 which are formed on the front surface of the carrier 21, a solder material 56 and a solder material 57 are respectively formed. When loading the photo diode array 23 on the carrier 21, the first connection wiring 66 and the first conductive type electrode 36a are electrically and physically connected to each other via the solder material 56, and the second connection wiring 67 and the second conductive type electrode 37a are electrically and physically connected to each other via the solder material 57.

The electric signal controller 30 includes a plurality of IC terminal groups 70 (refer to FIG. 5) that electrically connects the plurality of element terminal groups 24 and the IC chip 40 to each other and are disposed to be aligned in order along the first direction. The plurality of IC terminal groups 70 are disposed on the upper surface of the electric signal controller 30.

The IC chips 40 are electrically connected to each of the plurality of photo diodes 22, and control the plurality of electric signals output by the plurality of photo diodes 22. The IC chip 40 is provided with, for example, a preamplifier circuit which amplifies the plurality of electric signals output by the plurality of photo diodes 22 and detects the electric signal as a photocurrent. Furthermore, in the embodiment, the IC chip 40 and the electric signal controller 30 are described as separated bodies, but a controller which is an integrated circuit and a part of which is an amplifier circuit (IC chip 40) is included as the electric signal controller 30.

The plurality of element terminal groups 24 and the plurality of IC terminal groups 70 face each other while being separated from each other. In addition, the plurality of element terminal groups 24 and the plurality of IC terminal groups 70 are electrically connected to each other via the wire. Hereinafter, by using FIG. 5, a specific configuration of the plurality of element terminal groups 24 and the plurality of IC terminal groups 70 in the optical receiving subassembly 10 according to a first example of the first embodiment will be described.

Figure 5:
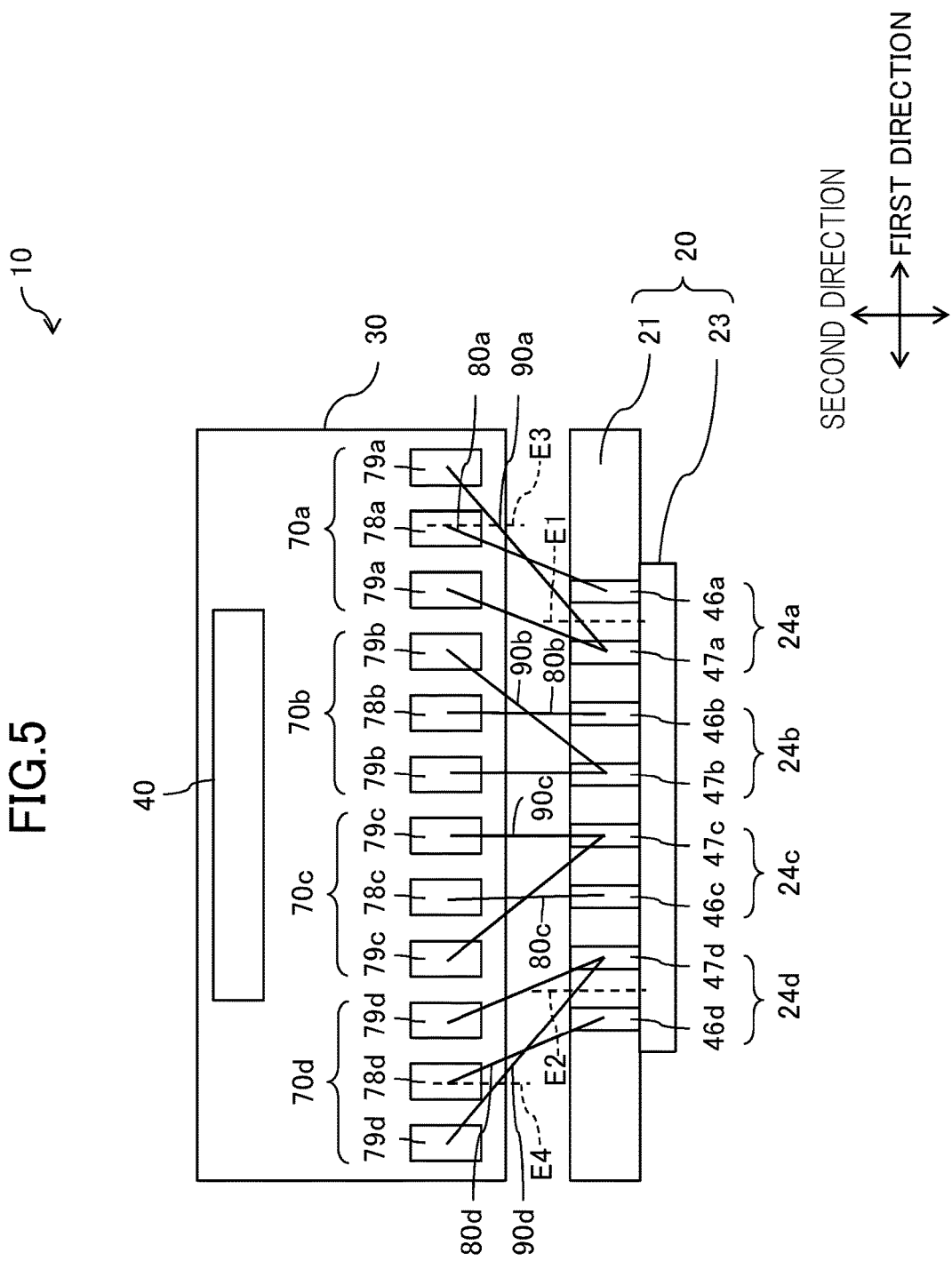
FIG. 5 is a plan view of an optical receiving subassembly according to a first example of the first embodiment.

FIG. 5 is a plan view of the optical receiving subassembly 10 according to the first example of the first embodiment. As illustrated in FIG. 5, in the first example of the first embodiment, each of four element terminal groups 24 (24a to 24d) (corresponding to any one of the plurality of element terminal groups and the plurality of IC terminal groups) has a two-terminal configuration, and each of four IC terminal groups 70 (70a to 70d) (corresponding to the other one of the plurality of element terminal groups and the plurality of IC terminal groups) has a three-terminal configuration. In the two-terminal configuration, the first conductive type first connection terminal 46 and the second conductive type second connection terminal 47 extend together in a second direction intersecting the first direction when viewed from the upper surface side of the carrier 21 and are disposed to be aligned along the first direction. In addition, in the three-terminal configuration, a first conductive type third connection terminal 78 and two second conductive type fourth connection terminals 79 also extend together in the second direction and are disposed to be aligned along the first direction in order of one of the fourth connection terminals 79, the third connection terminal 78, and the other one of the fourth connection terminals 79. The second direction is the direction intersecting the first direction, and here, the second direction is orthogonal to the first direction. The first example of the first embodiment illustrates a case where each of four element terminal groups 24a to 24d has the above-described two-terminal configuration and each of four IC terminal groups 70a to 70d has the above-described three-terminal configuration.

In addition, in the first direction, each of center positions (E1 and E2) of the element terminal group 24a and the element terminal group 24d which are at both ends of four element terminal groups 24 is further on the inner side together than center positions (E3 and E4) of the IC terminal group 70a and the IC terminal group 70d which are at both ends in four IC terminal groups 70. The first example illustrates a case where both ends (the element terminal group 24a and the element terminal group 24d) of four element terminal groups 24 (24a to 24d) are both ends at which the center positions are on the inner side together, and both ends at which the center positions are on the inner side together have the two-terminal configuration. In each of the two-terminal configurations in the element terminal groups 24 (the element terminal group 24a and the element terminal group 24d) which are at both ends among four element terminal groups 24 (24a to 24d), the first connection terminal 46 is disposed further on the outer side than the second connection terminal 47. Here, in the element terminal group 24a, the first connection terminal 46a is disposed further on the outer side than the second connection terminal 47a, and in the element terminal group 24d, a first connection terminal 46d is disposed further on the outer side than a second connection terminal 47d. In the specification, when illustrating a positional relationship of the element terminal groups and the IC terminal groups unless otherwise specified, the positional relationship of both ends of the terminal group is expressed as the inner side and the outer side, but this indicates a positional relationship of the center positions (in FIG. 5, E1 to E4) of the terminal groups in the first direction. Here, the center positions of the terminal group are center points of line segments that link positions which are outer edges of each of the terminals on both sides along the first direction. In addition, both ends of the terminal group indicate terminal groups (in FIGS. 5, 24a, 24d, 70a, and 70d) at both ends of the plurality of terminal groups.

In addition, each of the element terminal groups 24a to 24d is electrically connected to the corresponding IC terminal groups 70a to 70d via a wire 80 (80a to 80d) and a wire 90 (90a to 90d). The first connection terminal 46a of the element terminal group 24a is electrically connected to a third connection terminal 78a of the corresponding IC terminal group 70a via the wire 80a. In addition, the second connection terminal 47a of the element terminal group 24a is electrically connected to each of two fourth connection terminals 79a of the corresponding IC terminal group 70a via the wire 90a. The connection of the element terminal groups 24b to 24d and the IC terminal groups 70b to 70d also has a configuration similar to that of the connection of the element terminal group 24a and the IC terminal group 70a.

According to the first example of the first embodiment, in each of the two-terminal configurations in the element terminal groups 24 (the element terminal group 24a and the element terminal group 24d) of both ends, compared to a case where the first connection terminal 46 is disposed further on the inner side than the second connection terminal 47, it is possible to shorten the length of the wire 80 that links the first connection terminal 46 and the third connection terminal 78 to each other in each of the element terminal groups 24 of both ends. In this manner, it is possible to employ a structure in which the wire 80 is shortened in the element terminal group 24 of both ends at which the length of the wire 80 can become the longest, and as a result, inductance of the channels (here, the first channel and the fourth channel) at both ends deteriorates and deterioration of the frequency response characteristics can be suppressed.

Furthermore, it is desirable that the center lines in the first direction of the plurality of element terminal groups 24 and the center lines in the first direction of the plurality of IC terminal groups 70 are closer to each other, and it is more desirable that the center lines are substantially identical to each other. In the case, it is possible to shorten two wires 80 disposed at both ends together, and to reduce the difference in lengths of two wires 80. More desirably, the lengths of two wires 80 can be identical to each other.

In addition, not only the disposition of the first connection terminal 46 and the second connection terminal 47 in the two-terminal configuration at both ends, but also repetition of the plurality of two-terminal configurations in which the first connection terminal 46 and the second connection terminal 47 are disposed in order from each of the two ends to the inner side (the center line in the first direction of the carrier 21 or the center lines in the first direction of the plurality of element terminal groups 24), is desirable. Similar to the two-terminal configuration at both ends, one pair of two-terminal configurations disposed further on the inner side from both ends by the same number can have a structure in which the length of the wire 80 can further be shortened.

Here, in a case where the numbers of element terminal groups 24 and IC terminal groups 70 are respectively N, and in a case where N is an even number which is equal to or greater than 4, the center line in the first direction of N element terminal groups 24 penetrates between the N/2-nd element terminal group 24 and the N/2+1-th element terminal group 24 from one end, and the center line in the first direction of N IC terminal groups 70 penetrates between the N/2-nd IC terminal group 70 and the N/2+1-th IC terminal group 70 from one end. At this time, it is desirable that the center lines in the first direction of N element terminal groups 24 penetrate between the N/2-nd IC terminal group 70 and the N/2+1-th IC terminal group 70 from one end, and it is more desirable that the center lines in the first direction of N element terminal groups 24 and the center lines in the first direction of N IC terminal groups 70 are identical to each other. In addition, it is desirable that N/2 element terminal groups 24 in which the first connection terminal 46 and the second connection terminal 47 are disposed in order are repeated toward the center lines of each of the two ends of N element terminal groups 24.

In addition, in a case where N is an odd number which is equal to or greater than 5, the center line in the first direction of N element terminal groups 24 penetrates the (N+1)/2-nd element terminal group 24 from one end, and the center line in the first direction of N IC terminal groups 70 penetrates the (N+1)/2-nd IC terminal group 70 from one end. At this time, it is desirable that the center line in the first direction of N element terminal groups 24 penetrates the (N+1)/2-nd IC terminal group 70 from one end, and it is more desirable that the center line in the first direction of N element terminal groups 24 and the center lines in the first direction of N IC terminal groups 70 are identical to each other. In addition, it is desirable that (N−1)/2 element terminal groups 24 in which the first connection terminal 46 and the second connection terminal 47 are disposed in order are repeated toward the center lines from each of the two ends of N element terminal groups 24. At this time, the order of disposition of the first connection terminal 46 and the second connection terminal 47 in the (N+1)/2-nd element terminal group 24 may be arbitrarily determined.

In this manner, as the center lines in the first direction of the plurality of element terminal groups 24 and the center lines in the first direction of the plurality of IC terminal groups 70 come closer to each other, and more desirably, are substantially identical to each other, it is possible to reduce the difference in length of the wires 80 (the wire 80a and the wire 80d) of both ends, and to make the frequency response characteristics of the channels of both ends become close to each other. Furthermore, as the plurality of two-terminal configurations in which the first connection terminal 46 and the second connection terminal 47 are disposed in order are repeated from each of the two ends of the plurality of element terminal groups 24 to the inner side, it is possible to reduce deviation of the lengths of each of the wires 80, and as a result, it is possible to reduce deviation of the frequency response characteristics of the plurality of channels.

Here, the result of performing characteristics evaluation of the optical receiving subassembly 10 according to the first example of the first embodiment is illustrated. A reverse bias voltage of 1.5 V is applied to each of the first connection terminals 46a to 46d, the optical signal having the wavelength of 1310 nm and the strength of 10 µW is input into each of the light receiving windows 25, and thus, the responsivity of 0.8 A/W is obtained in each of the channels together. In addition, regarding a dark current at a reverse bias voltage of 1.5 V, a value which is sufficiently low, such as 1 nA or lower at the room temperature and 10 nA or lower at 85°, is obtained in each of the channels together.

Figure 6:
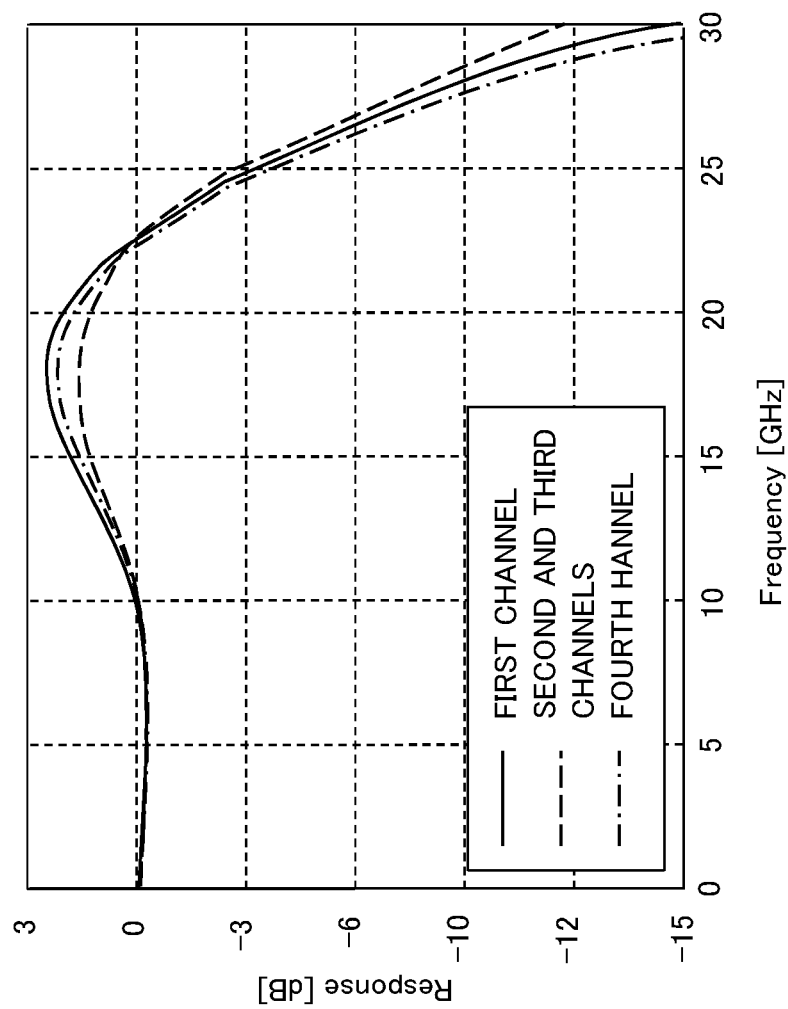
FIG. 6 is a view illustrating frequency response characteristics of each of the channels according to the first embodiment.
Figure 16:
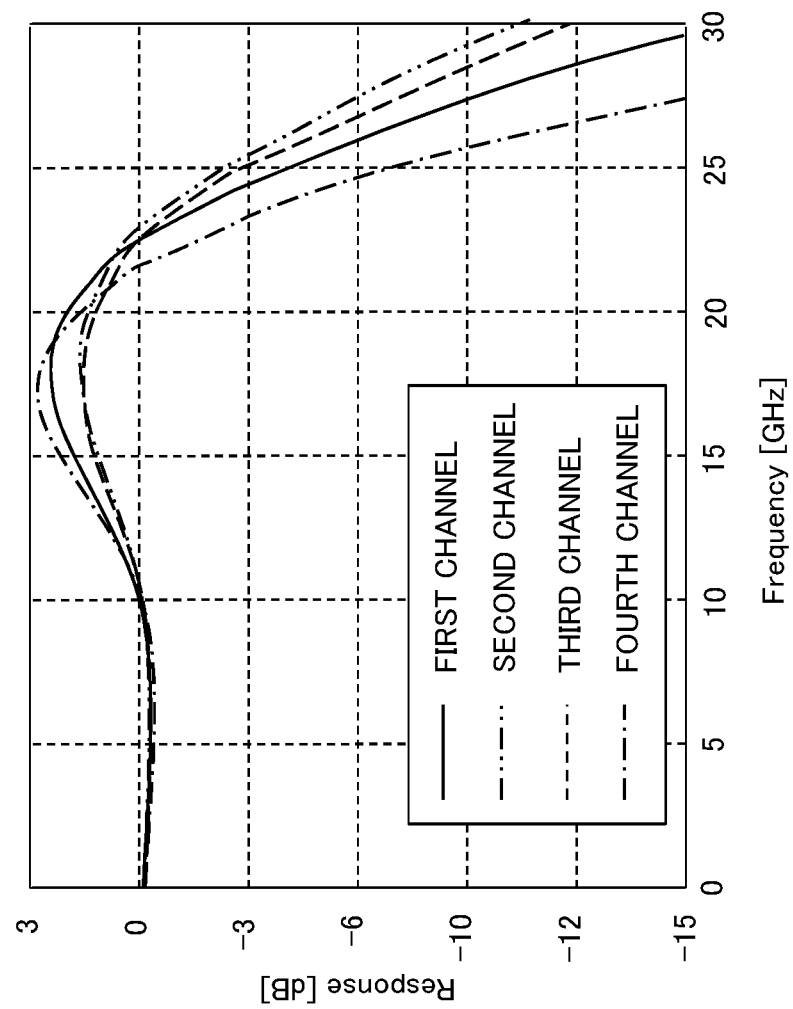
FIG. 16 is a view illustrating frequency response characteristics of each of the channels according to the technology of the related art.

FIG. 6 is a view illustrating frequency response characteristics of each of the channels according to the first example of the first embodiment. As illustrated in FIG. 6, regarding the frequency response characteristics of the first channel and the fourth channel of both ends, peaking which is in the vicinity of 15 to 20 GHz becomes higher compared to those of the second channel and the third channel on the inner side, but excellent frequency response characteristics in which a 3 dB cutoff frequency is approximately 25 GHz in all of the channels are obtained. In addition, compared to the frequency response characteristics according to the related art illustrated in FIG. 16, the frequency response characteristics of the fourth channel are improved, and the frequency response characteristics of the first channel and the frequency response characteristics of the fourth channel become close to each other.

Figure 7:
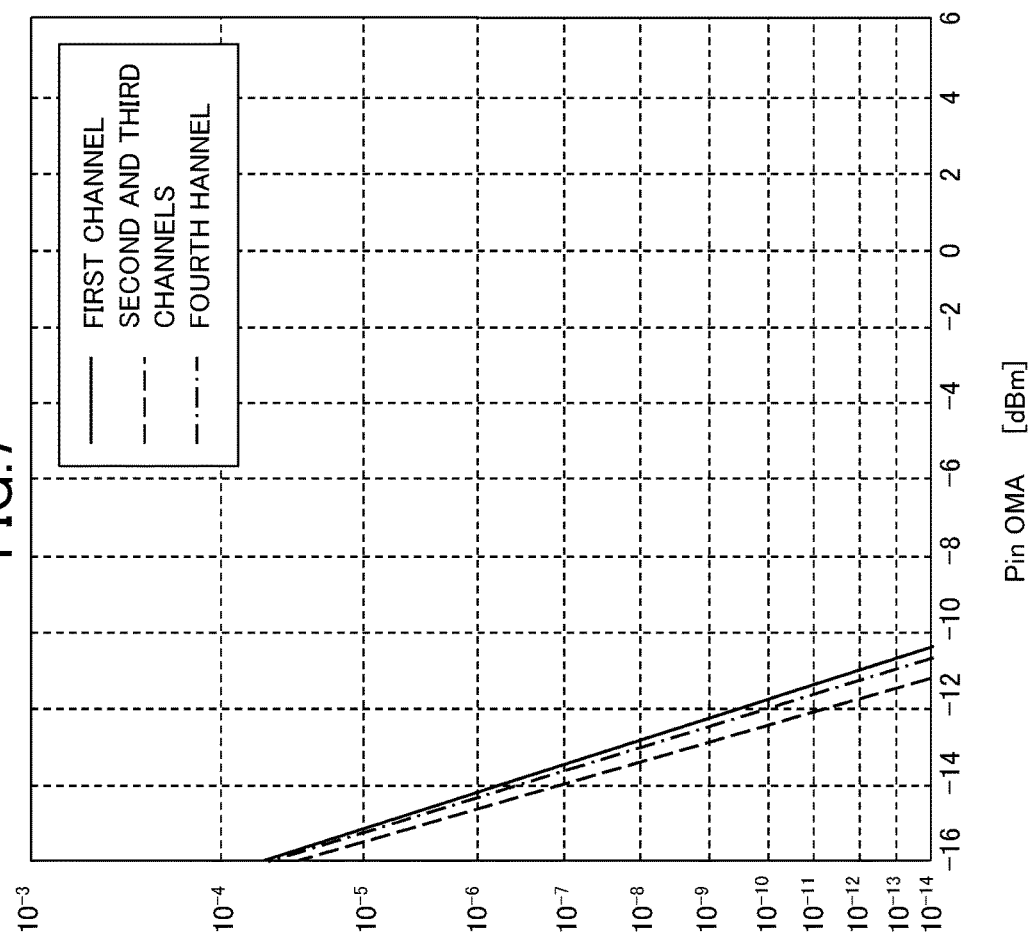
FIG. 7 is a view illustrating receiver sensitivity characteristics at 25 Gbps of each of the channels according to the first embodiment.

FIG. 7 is a view illustrating receiver sensitivity characteristics at 25 Gbps of each of the channels according to the first example of the first embodiment. As illustrated in FIG. 7, in all of the channels, excellent characteristics are obtained. In addition, compared to the receiver sensitivity characteristics according to the related art illustrated in FIG. 17, the receiver sensitivity characteristics of the fourth channel are improved, a floor is not drawn, and the receiver sensitivity characteristics of the first channel and the receiver sensitivity characteristics of the fourth channel become close to each other. In addition, although not illustrated, regarding overload characteristics, excellent characteristics in which the maximum receiver sensitivity Prmax becomes greater than 14.5 dBm are also obtained.

In this manner, according to the first example of the first embodiment, by improving the frequency response characteristics of the channels of both ends, and by reducing the deviation of the element characteristics of each of the channels, the optical receiving subassembly 10 can obtain excellent optical receiving characteristics.

In addition, a configuration of the plurality of element terminal groups 24 and the plurality of IC terminal groups 70 is not limited to the example illustrated in FIG. 5. Hereinafter, another example of the optical receiving subassembly 10 of the first embodiment will be described.

Figure 8:
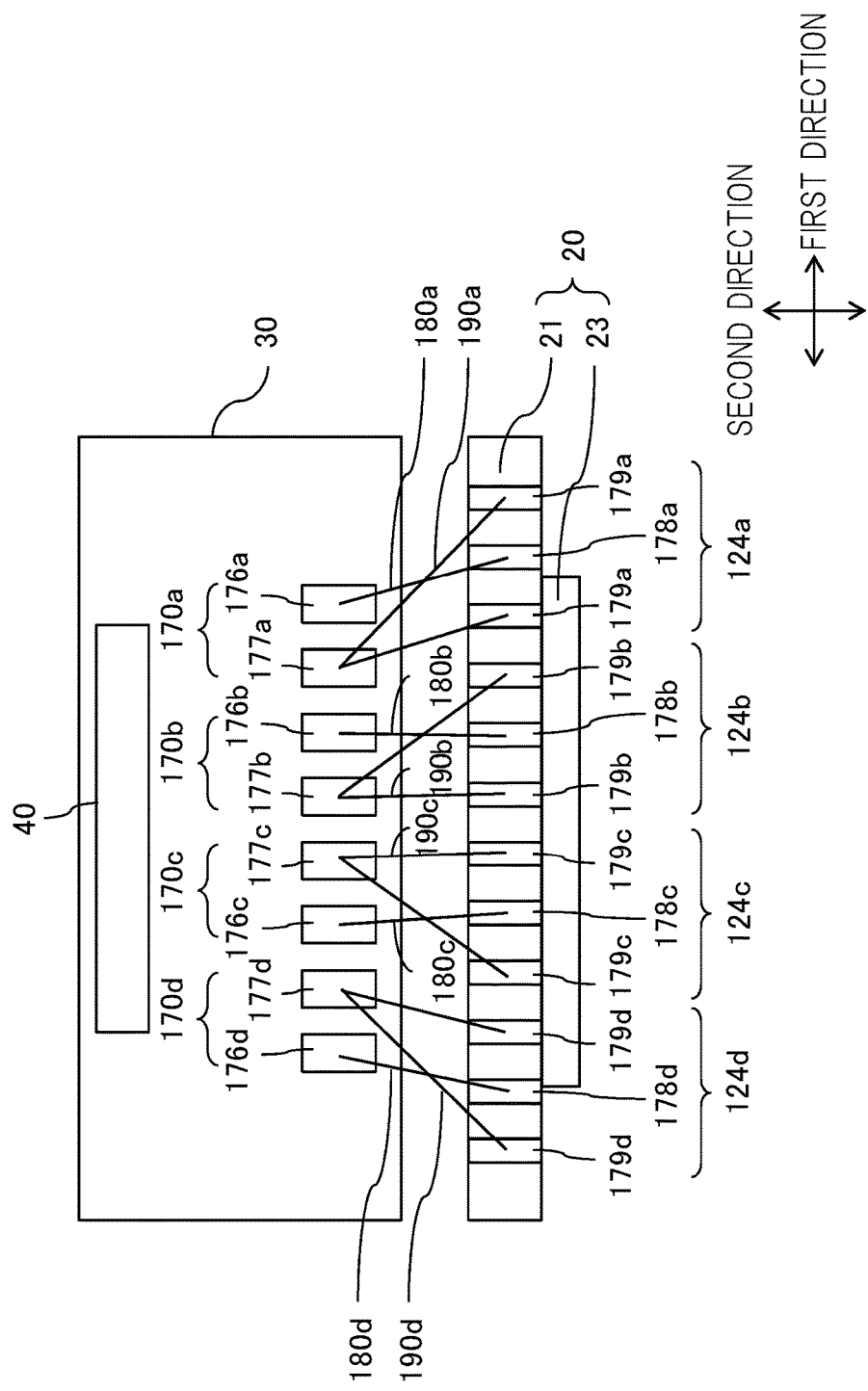
FIG. 8 is a plan view of an optical receiving subassembly according to a second example of the first embodiment.

FIG. 8 is a plan view of an optical receiving subassembly 100 according to a second example of the first embodiment. As illustrated in FIG. 8, the second example illustrates a case where each of four element terminal groups 124 (124a to 124d) has the three-terminal configuration, and each of four IC terminal groups 170 (170a to 170d) has the two-terminal configuration.

In addition, in the first direction, each of the center positions of the IC terminal group 170a and the IC terminal group 170d which are at both ends among four IC terminal groups 170 is further on the inner side than the center positions of the element terminal group 124a and the element terminal group 124d which are at both ends among four element terminal groups 124 together. The second example illustrates a case where both ends (the IC terminal group 170a and the IC terminal group 170d) of four IC terminal groups 170 (170a to 170d) are both ends at which the center positions thereof are on the inner side together and both ends at which the center positions thereof are on the inner side together respectively have the two-terminal configuration. In each of the two-terminal configurations in the IC terminal group 170 (the IC terminal group 170a and the IC terminal group 170d) which are at both ends among four IC terminal groups 170 (170a to 170d), a first connection terminal 176 is disposed further on the outer side than a second connection terminal 177. Here, in the IC terminal group 170a, a first connection terminal 176a is disposed further on the outer side than a second connection terminal 177a, and in the element terminal group 124d, a first connection terminal 176d is disposed further on the outer side than a second connection terminal 177d.

In addition, each of the element terminal groups 124a to 124d is electrically connected to the corresponding IC terminal groups 170a to 170d via wires 180 (180a to 180d)

and wires 190 (190*a* to 190*d*). The first connection terminal 176*a* of the IC terminal group 170*a* is electrically connected to a third connection terminal 178*a* of the corresponding element terminal group 124*a* via the wire 180*a*. In addition, the second connection terminal 177*a* of the IC terminal group 170*a* is electrically connected to each of two fourth connection terminals 179*a* of the corresponding element terminal group 124*a* via the wire 190*a*. Regarding the connection of the element terminal groups 124*b* to 124*d* and the IC terminal groups 170*b* to 170*d*, a configuration similar to that of the connection of the element terminal group 124*a* and the IC terminal group 170*a* is employed.

According to the second example of the first embodiment, in each of the two-terminal configurations in the IC terminal groups 170 (the IC terminal group 170*a* and the IC terminal group 170*d*) which are at both ends, compared to a case where the first connection terminal 176 is disposed further on the inner side than the second connection terminal 177, it is possible to shorten the length of the wire 180 that links the first connection terminal 176 and a third connection terminal 178 to each other in each of the IC terminal groups 170 which are at both ends. In this manner, a structure in which the wire 180 is shortened in the IC terminal groups 170 which are at both ends at which the length of the wire 180 can become the longest can be employed, and as a result, inductance in the channels (here, the first channel and the fourth channel) at both ends deteriorates, and the frequency response characteristics are improved.

Furthermore, similar to the first example, it is desirable that the center lines in the first direction of the plurality of element terminal groups 124 and the center lines in the first direction of the plurality of IC terminal groups 170 are closer to each other, and it is more desirable that the center lines are substantially identical to each other. In addition, not only the disposition of the first connection terminal 176 and the second connection terminal 177 in the two-terminal configuration at both ends, but also repetition of the plurality of two-terminal configurations in which the first connection terminal 176 and the second connection terminal 177 are disposed in order from each of the two ends to the inner side (the center line in the first direction of the electric signal controller 30 or the center lines in the first direction of the plurality of IC terminal groups 170), is desirable.

Figure 9:
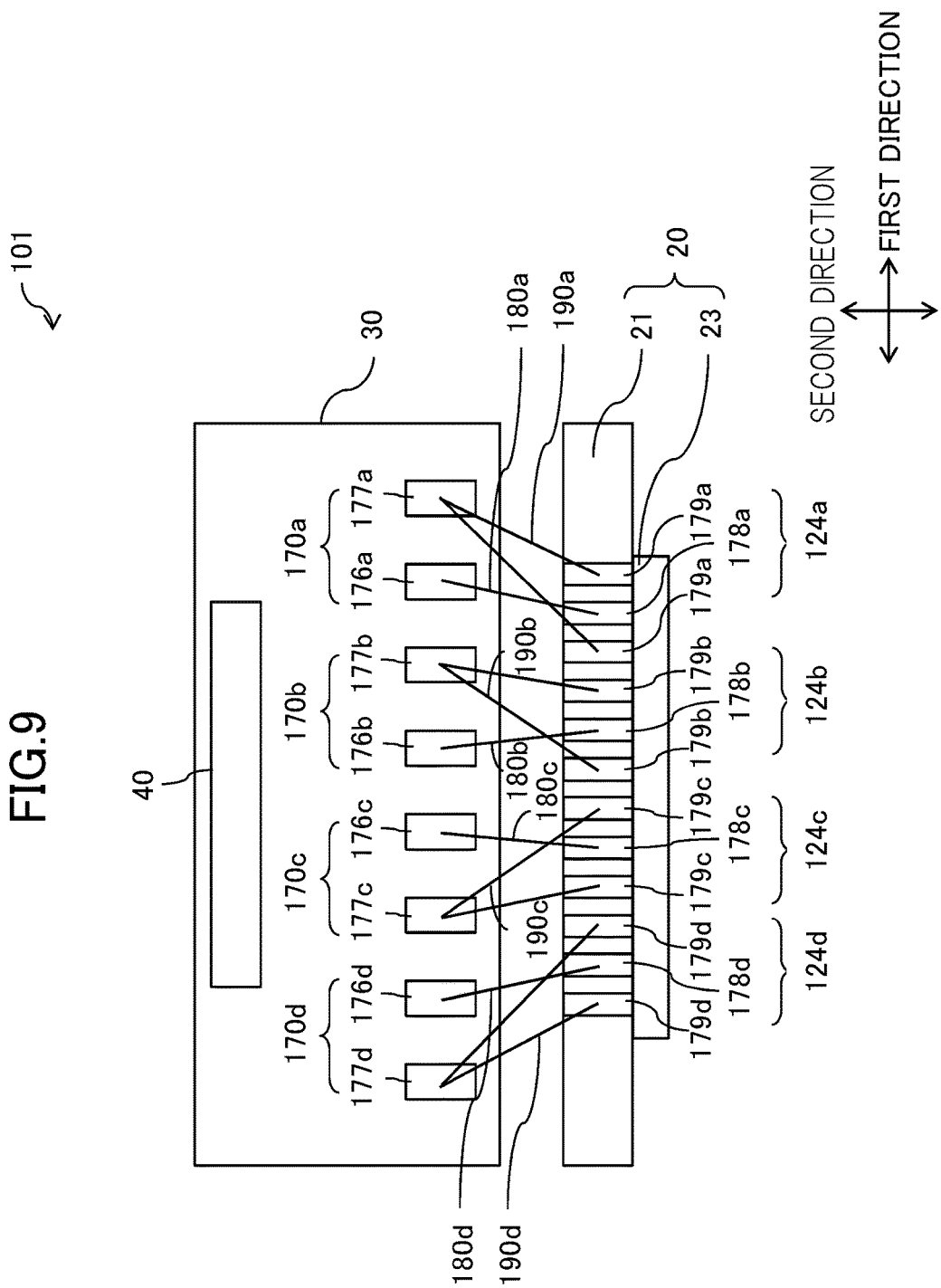
FIG. 9 is a plan view of an optical receiving subassembly according to a third example of the first embodiment.

FIG. 9 is a plan view of an optical receiving subassembly 101 according to a third example of the first embodiment. As illustrated in FIG. 9, similar to the second example, the third example illustrates a case where each of four element terminal groups 124 (124*a* to 124*d*) has a three-terminal configuration, and each of four IC terminal groups 170 (170*a* to 170*d*) has a two-terminal configuration. In the optical receiving subassembly 101 according to the third example, overlapping description will be omitted since the configuration of the element terminal group 124 and the IC terminal group 170 is similar to that of the optical receiving subassembly 100 according to the second example illustrated in FIG. 8. Here, only the configuration different from that of the optical receiving subassembly 100 according to the second example will be described.

In the first direction, each of the center positions of the IC terminal group 170*a* and the IC terminal group 170*d* which are at both ends among four IC terminal groups 170 is further on the outer side together than the center positions of the element terminal group 124*a* and the element terminal group 124*d* which are at both ends among four element terminal groups 124. The third example illustrates a case where both ends (the IC terminal group 170*a* and the IC terminal group 170*d*) of four IC terminal groups 170 (170*a* to 170*d*) are both ends at which the center positions thereof are on the outer side together and both ends at which the center positions thereof are on the outer side together respectively have the two-terminal configuration. In each of the two-terminal configurations in the IC terminal group 170 (the IC terminal group 170*a* and the IC terminal group 170*d*) which are at both ends among four IC terminal groups 170 (170*a* to 170*d*), the first connection terminal 176 is disposed further on the inner side than the second connection terminal 177. Here, in the IC terminal group 170*a*, the first connection terminal 176*a* is disposed further on the inner side than the second connection terminal 177*a*, and in the IC terminal group 170*d*, the first connection terminal 176*d* is disposed further on the inner side than a second connection terminal 177*d*.

In addition, each of the element terminal groups 124*a* to 124*d* is electrically connected to the corresponding IC terminal groups 170*a* to 170*d* via the wires 180 (180*a* to 180*d*) and the wires 190 (190*a* to 190*d*).

According to the third example of the first embodiment, in each of the two-terminal configurations in the IC terminal groups 170 (the IC terminal group 170*a* and the IC terminal group 170*d*) which are at both ends, compared to a case where the first connection terminal 176 is disposed further on the outer side than the second connection terminal 177, it is possible to shorten the length of the wire 180 that links the first connection terminal 176 and the third connection terminal 178 to each other in each of the IC terminal groups 170 which are at both ends. In this manner, a structure in which the wire 180 is shortened in the IC terminal groups 170 which are at both ends at which the length of the wire 180 can become the longest can be employed, and as a result, inductance in the channels (here, the first channel and the fourth channel) of both ends deteriorates, and the frequency response characteristics are improved.

Furthermore, similar to the first and second examples, it is desirable that the center lines in the first direction of the plurality of element terminal groups 124 and the center lines in the first direction of the plurality of IC terminal groups 170 are closer to each other, and it is more desirable that the center lines are substantially identical to each other. In addition, not only the disposition of the first connection terminal 176 and the second connection terminal 177 in the two-terminal configuration at both ends, but also repetition of the plurality of two-terminal configurations in which the second connection terminal 177 and the first connection terminal 176 are disposed in order from each of the two ends to the inner side (the center line in the first direction of the electric signal controller 30 or the center lines in the first direction of the plurality of IC terminal groups 170), is desirable.

Figure 10:
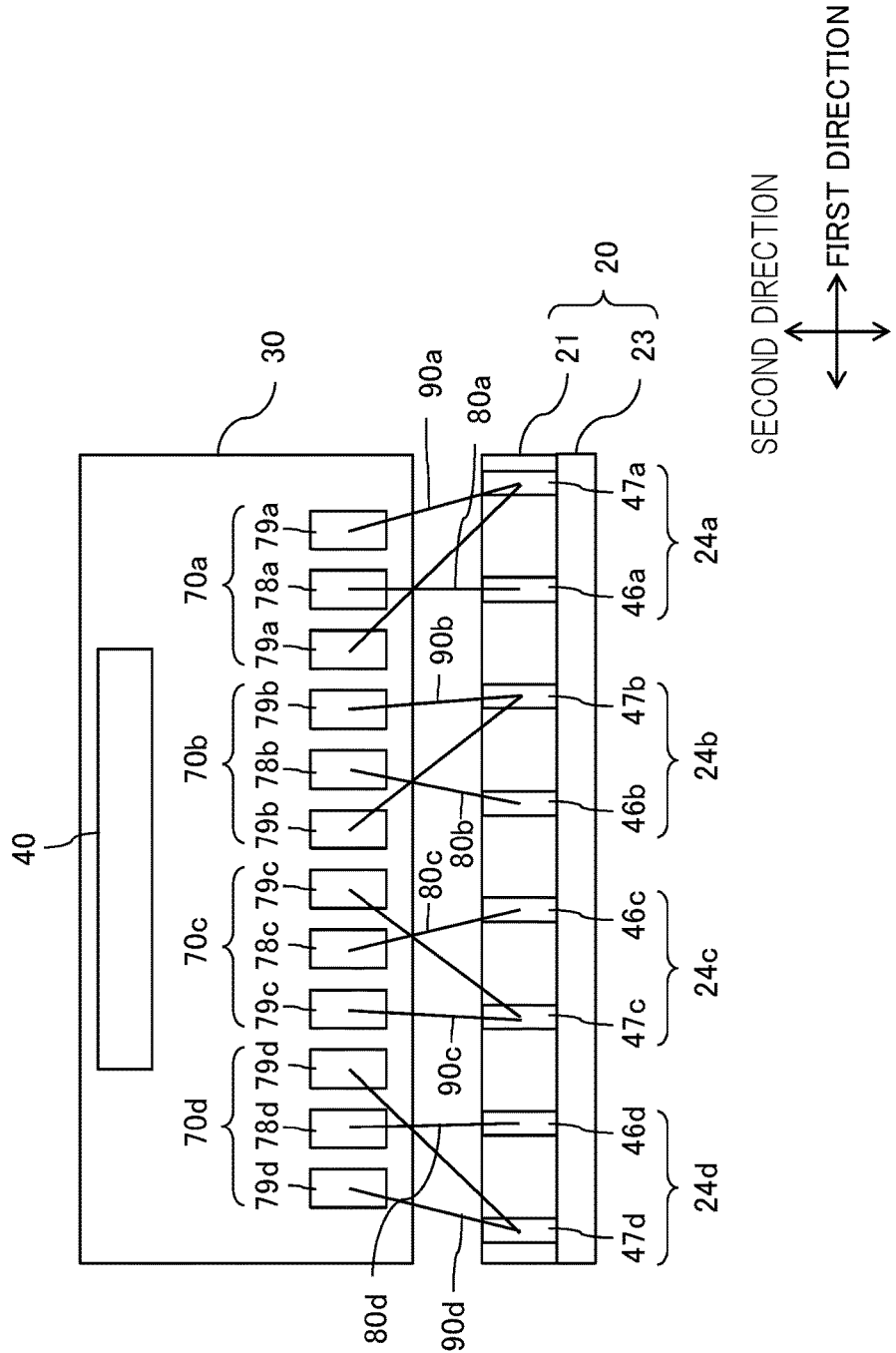
FIG. 10 is a plan view of an optical receiving subassembly according to a fourth example of the first embodiment.

FIG. 10 is a plan view of the optical receiving subassembly according to a fourth example of the first embodiment. As illustrated in FIG. 10, similar to the first example, the fourth example illustrates a case where each of four element terminal groups 24*a* to 24*d* has the above-described two-terminal configuration, and each of four IC terminal groups 70*a* to 70*d* has the above-described three-terminal configuration. In an optical receiving subassembly 102 according to the fourth example, the overlapping description will be omitted since the configuration of the element terminal group 24 and the IC terminal group 70 is similar to that of the optical receiving subassembly 10 illustrated in FIG. 5. Here, only the configuration different from that of the optical receiving subassembly 10 illustrated in FIG. 5 will be described.

In the first direction, each of the center positions of the element terminal group 24a and the element terminal group 24d which are at both ends among four element terminal groups 24 is further on the outer side together than the center positions of the IC terminal group 70a and the IC terminal group 70d which are at both ends among four IC terminal groups 70. The fourth example illustrates a case where both ends (the element terminal group 24a and the element terminal group 24d) of four element terminal groups 24 (24a to 24d) are both ends at which the center positions thereof are on the outer side together and both ends at which the center positions thereof are on the outer side together respectively have the two-terminal configuration. In each of the two-terminal configurations in the element terminal groups 24 (the element terminal group 24a and the element terminal group 24d) which are at both ends among four element terminal groups 24 (24a to 24d), the first connection terminal 46 is disposed further on the inner side than the second connection terminal 47. Here, in the element terminal group 24a, the first connection terminal 46a is disposed further on the inner side than the second connection terminal 47a, and in the element terminal group 24d, the first connection terminal 46d is disposed further on the inner side than the second connection terminal 47d.

In addition, each of the element terminal groups 24a to 24d is connected to the corresponding IC terminal groups 70a to 70d via the wires 80 (80a to 80d) and the wires 90 (90a to 90d).

According to the fourth example of the first embodiment, in each of the two-terminal configurations in the element terminal groups 24 (the element terminal group 24a and the element terminal group 24d) which are at both ends, compared to a case where the first connection terminal 46 is disposed further on the outer side than the second connection terminal 47, it is possible to shorten the length of the wire 80 that links the first connection terminal 46 and the third connection terminal 78 to each other in each of the element terminal group 24 which are at both ends. In this manner, a structure in which the wire 80 is shortened in the element terminal groups 24 which are at both ends at which the length of the wire 80 can become the longest can be employed, and as a result, inductance in the channels (here, the first channel and the fourth channel) of both ends deteriorates, and the frequency response characteristics are improved.

Furthermore, similar to the first and third examples, it is desirable that the center lines in the first direction of the plurality of element terminal groups 24 and the center lines in the first direction of the plurality of IC terminal groups 70 are closer to each other, and it is more desirable that the center lines are substantially identical to each other. In addition, not only the disposition of the first connection terminal 46 and the second connection terminal 47 in the two-terminal configuration at both ends, but also repetition of the plurality of two-terminal configurations in which the second connection terminal 47 and the first connection terminal 46 are disposed in order from each of the two ends to the inner side (the center line in the first direction of the carrier 21 or the center lines in the first direction of the plurality of element terminal groups 24), is desirable.

In this manner, in the optical receiving subassembly according to the embodiment, the plurality of element terminal groups and the plurality of IC terminal groups face each other while being separated from each other, any one of the plurality of element terminal groups and the plurality of IC terminal groups respectively has the two-terminal configuration in which the first conductive type first connection terminal and the second conductive type second connection terminal extend together in the second direction intersecting the first direction and are respectively disposed to be aligned along the first direction, and the other one of the plurality of element terminal groups and the plurality of IC terminal groups respectively has the three-terminal configuration in which the first conductive type third connection terminal and the two second conductive type fourth connection terminals extend together in the second direction and are disposed to be aligned along the first direction in order of one of the fourth connection terminals, the third connection terminal, and the other one of the fourth connection terminals. In addition, in the first direction, each of the center positions of the element terminal groups which are at both ends among the plurality of element terminal groups is further on the inner side together, or on the outer side together than the center positions of the IC terminal groups at both ends among the plurality of IC terminal groups, and among both ends of the plurality of element terminal groups and both ends of the plurality of IC terminal groups, in a case where both ends at which the center positions are on the inner side together respectively have the two-terminal configuration, in each of the two-terminal configurations at both ends at which the center positions are on the inner side together, the first connection terminal is disposed further on the outer side than the second connection terminal, and among both ends of the plurality of element terminal groups and both ends of the plurality of IC terminal groups, in a case where both ends at which the center positions are on the outer side together respectively have the two-terminal configuration, in each of the two-terminal configurations at both ends at which the center positions are on the outer side together, the first connection terminal is disposed further on the inner side than the second connection terminal. In addition, the first connection terminal in the two-terminal configuration is electrically connected to the third connection terminal in the corresponding three-terminal configuration by the wire. In addition, the second connection terminal in the two-terminal configuration is electrically connected to each of two fourth connection terminals in the corresponding three-terminal configuration by the wire.

As the optical receiving subassembly according to the first embodiment has the above-described configuration, it is possible to shorten the length of the wire in the channels of both ends at which the length of the wire can become the longest. As a result, deterioration of the frequency response characteristics of the channels of both ends is suppressed, the deviation of the element characteristics of each of the channels is caused to be reduced, and the optical receiving subassembly can obtain excellent frequency response characteristics.

Second Embodiment

Figure 11:
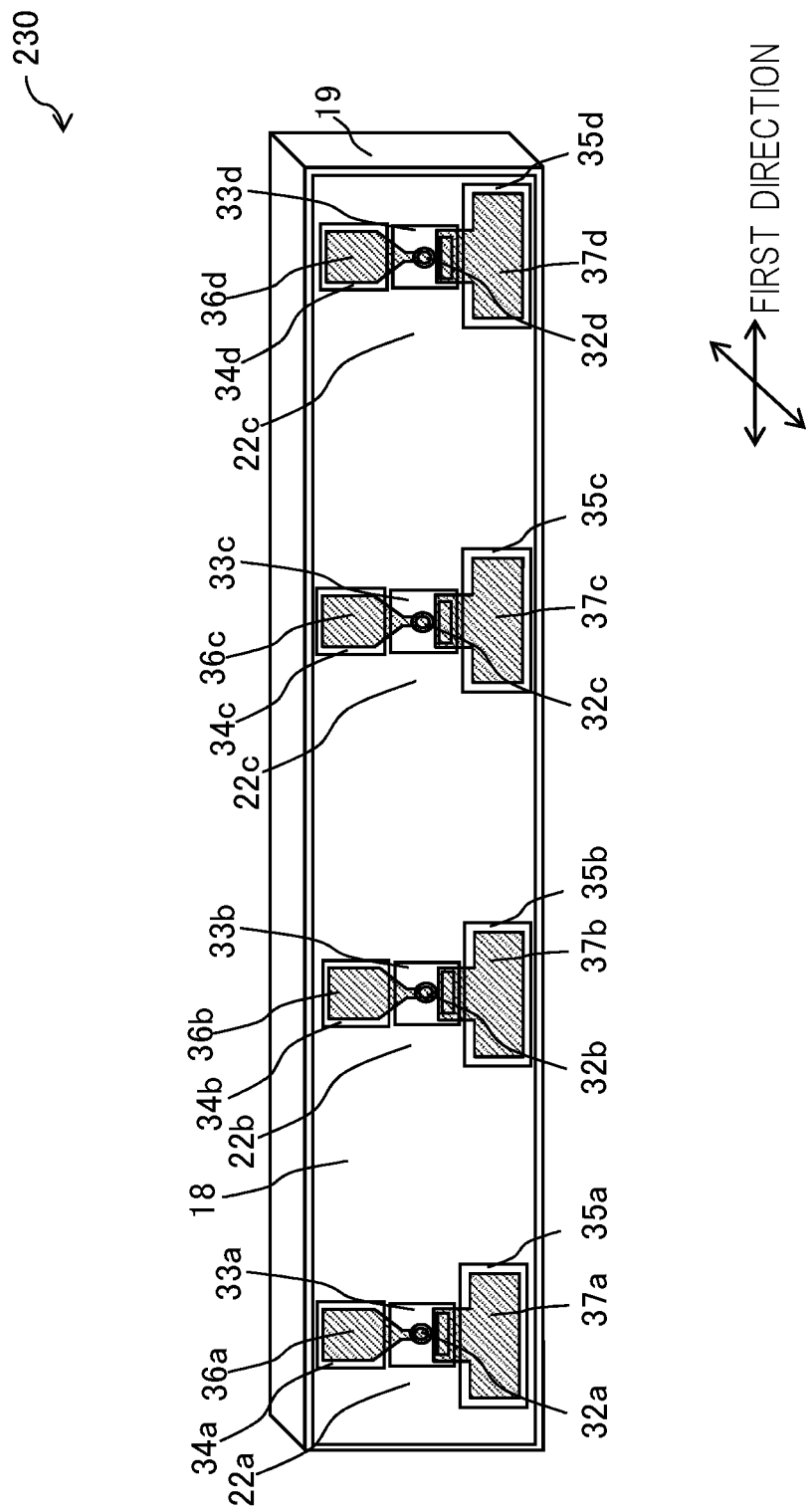
FIG. 11 is a perspective view of a photo diode array according to a second embodiment viewed from a front surface side.

FIG. 11 is a perspective view of a photo diode array 230 according to the second embodiment viewed from the front surface side. Since the photo diode array 230 according to the second embodiment has a similar configuration to that of the photo diode array 23 according to the first embodiment except that the disposition of each of the photo diodes 22 and the connection wiring which connects each of the photo diodes 22 and the element terminal groups 24 to each other are different, the overlapping description will be omitted. Here, a configuration different from that of the photo diode array 23 according to the first embodiment will be described.

In the photo diode array 230, on the semi-insulating Fe-doped InP substrate 19, in order from the left side, the first photo diode 22a, the second photo diode 22b, the third photo diode 22c, and the fourth photo diode 22d, are formed. The first conductive type electrode 36 of each of the photo diodes 22 is disposed further on the upper surface side than the second conductive type electrode 37. In addition, the first conductive type electrode 36 of each of the photo diodes 22 may be disposed further on the lower surface side than the second conductive type electrode 37. In other words, the first conductive type electrode 36 and the second conductive type electrode 37 of each of the photo diodes 22 are disposed to be aligned in the direction intersecting the direction in which each of the photo diodes 22 is arranged.

Figure 12:
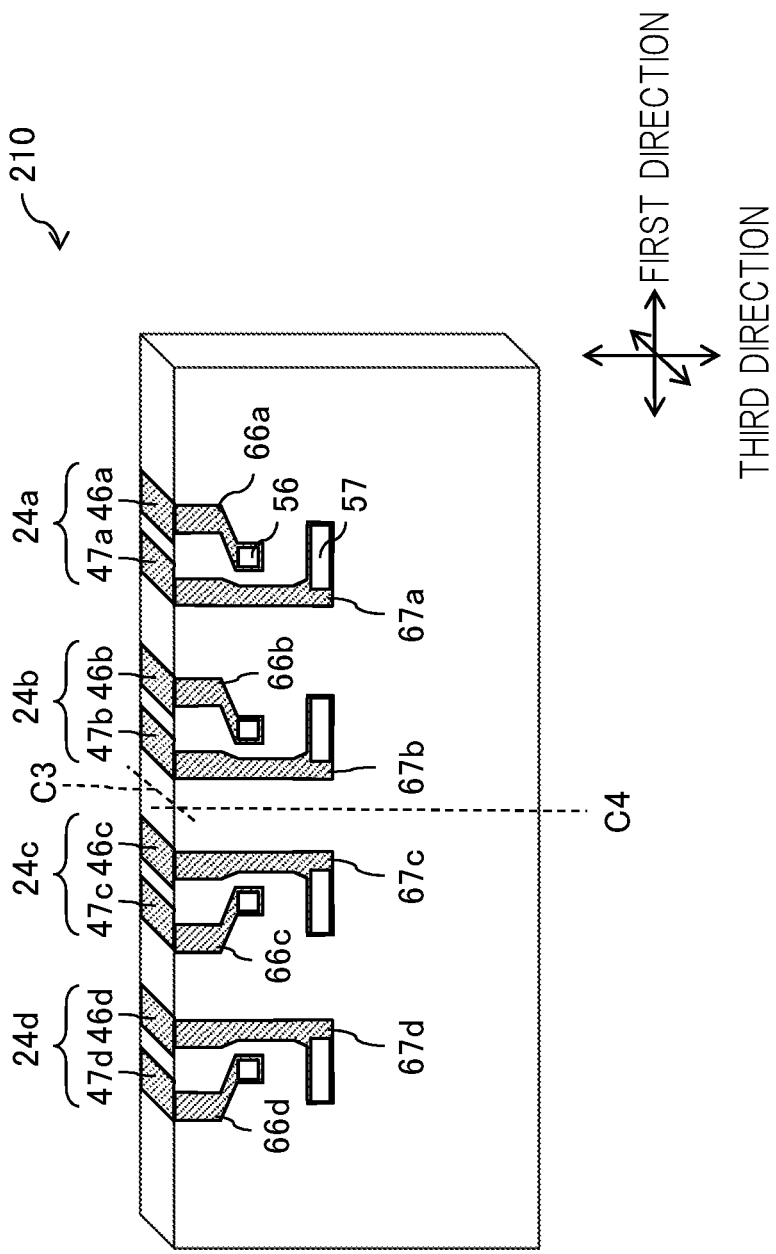
FIG. 12 is a perspective view of a carrier according to the second embodiment viewed from a front surface side.
Figure 13:
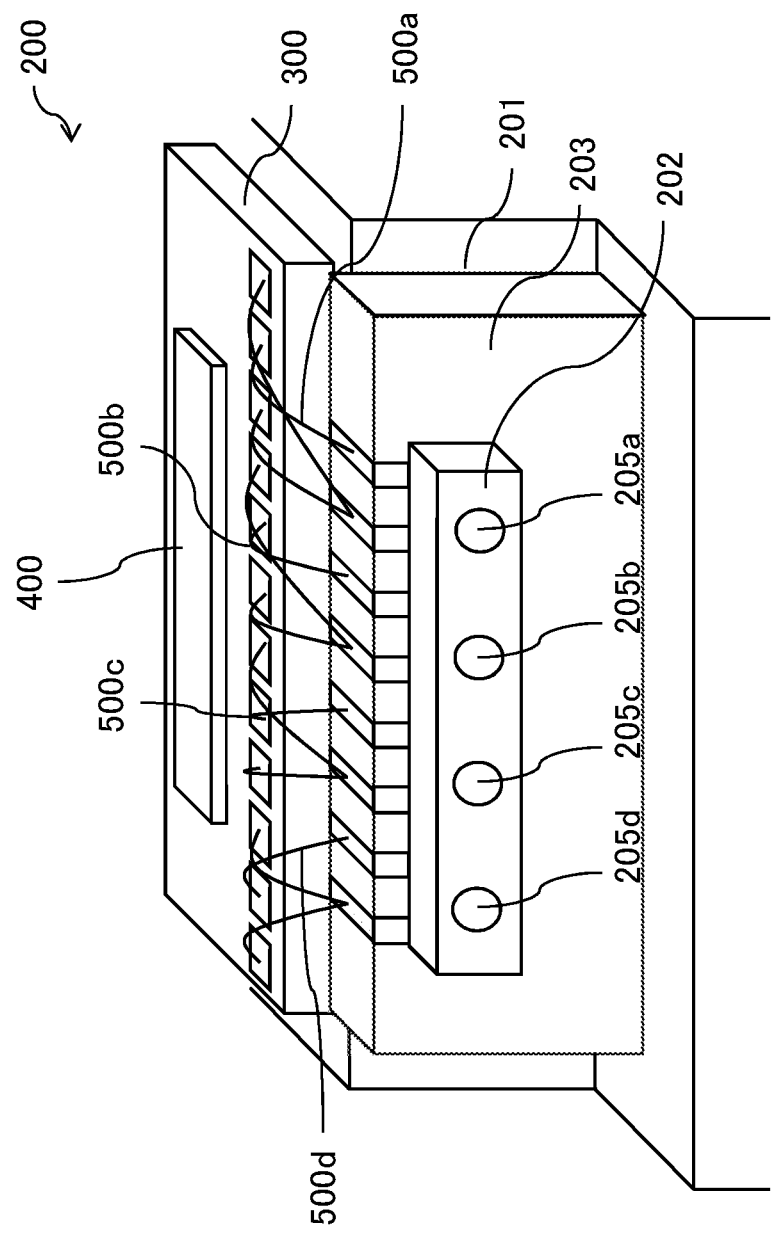
FIG. 13 is a partial exploded perspective view of an optical receiving subassembly accommodated in an optical module according to the technology of the related art.
Figure 14:
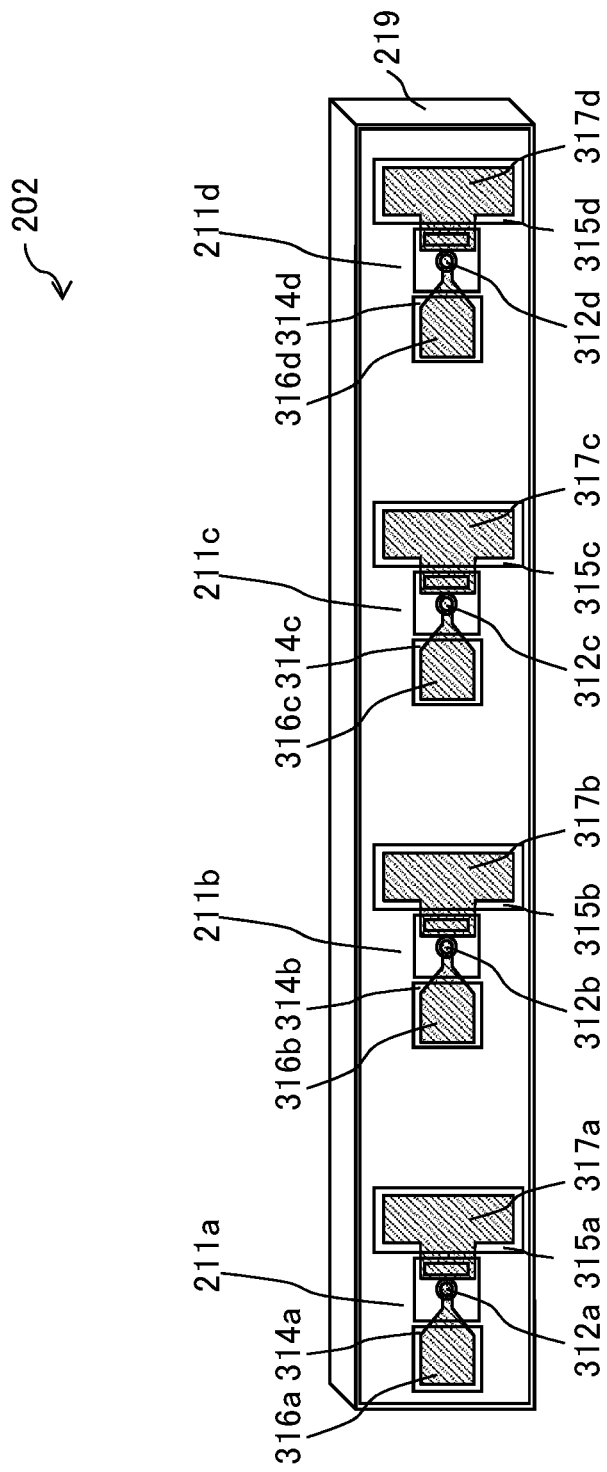
FIG. 14 is a perspective view of a photo diode array according to the technology of the related art viewed from an electrode side.
Figure 15:
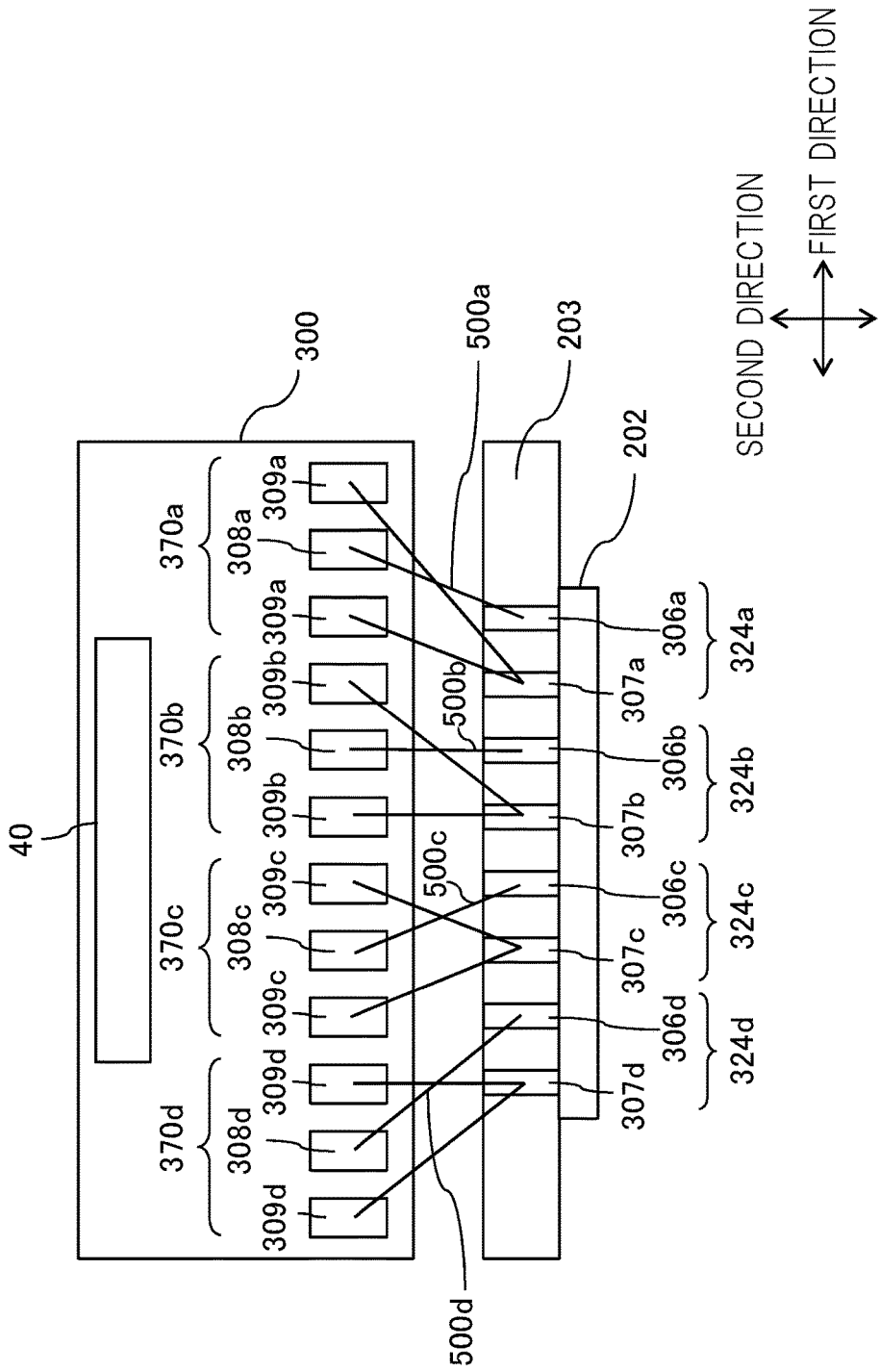
FIG. 15 is an upper view of the optical receiving subassembly according to the technology of the related art illustrated in FIG. 13.

FIG. 12 is a perspective view of a carrier 210 according to the second embodiment viewed from the front surface side. In the photo diode array 230 of the second embodiment, the first conductive type electrode 36 of each of the photo diodes 22 and the second conductive type electrode 37 are aligned in the direction (third direction) intersecting the direction (first direction) in which each of the photo diodes 22 is arranged on the front surface of the carrier 210. Here, at least one of the first connection wiring 66 and the second connection wiring 67 has a bent part on the front surface of the carrier 210 such that the first connection terminals 46 of each of the element terminal groups 24 are disposed further on the outer side than the second connection terminals 47 with respect to a center line C3 (center line in the first direction which is the direction in which the element terminal groups 24 are arranged) of the carrier 210 on the front surface of the carrier 210. For example, as illustrated in FIG. 12, in one pair of the first connection wiring 66 and the second connection wiring 67, the first connection wiring 66 is disposed further on the outer side (a side further than a center line C4 in the first direction on the front surface of the carrier 210) than the center line in the first direction of the photo diode 22 on the front surface of the carrier 210, and the second connection wiring 67 is disposed further on the inner side (a side further than the center line C4 in the first direction on the front surface of the carrier 210) than the center line in the first direction of the photo diode 22.

As described in the second embodiment, even in a case where the first conductive type electrode 36 of each of the photo diodes 22 and the second conductive type electrode 37 are aligned in the direction intersecting the direction in which each of the photo diodes 22 is arranged on the front surface of the carrier 210, the first connection terminal 46 of each of the element terminal groups 24 can be disposed further on the outer side than the second connection terminal 47 with respect to the center line C3 of the carrier. Accordingly, similar to the first embodiment, it is possible to shorten the length of the wire in the channels of both ends at which the length of the wire can become the longest. As a result, deterioration of the frequency response characteristics of the channels of both ends is suppressed, the deviation of the frequency response characteristics of each of the channels is caused to be reduced, and the optical receiving subassembly 10 can obtain excellent frequency response characteristics.

In addition, as the first conductive type electrode 36 of each of the photo diodes 22 and the second conductive type electrode 37 are disposed to be aligned in the direction orthogonal to the direction in which each of the photo diodes 22 is arranged, it is not necessary to change the arrangement of probe needles in a case of continuously inspecting the electric characteristics from the first channel to the fourth channel by using the probe needle before loading the photo diode array 230 on the carrier 210, and the inspection becomes easy.

In addition, the present invention is not limited to the above-described embodiments. For example, in the above-described embodiments, the rear surface incident type photo diode array in which the light is incident from the rear surface of the semiconductor substrate is described as an example, but an aspect in which the light receiving mesa portion is on the front side and is disposed on the carrier on the rear surface side may be employed. In the case, electric connection of the photo diode array and the carrier is performed by the wire. Furthermore, in a case of the embodiment, the wire may be connected to the IC terminal group of the electric signal controller directly from the electrode of the photo diode array. In this case, the electrode of the photo diode array may be the element terminal group.

Furthermore, in the above-described embodiments, the connection of the array type optical receiver module and the electric signal controller in the optical receiving subassembly is described, but connection of the array type semiconductor laser device and the driving circuit in the optical transmitting subassembly can also be employed. In a case of employing the invention in the optical transmitting subassembly, the IC chip suppresses the electric signal output to the plurality of light-receiving elements.

In addition, in the above-described embodiments, the element terminal group in the carrier is disposed on the upper surface different from the surface (front surface) on which the light-receiving element is disposed, but may be the same surface as the surface on which the light-receiving element is disposed or a third surface (for example, a rear surface portion).

In addition, the embodiment in which the IC chip is provided on the inside of the optical subassembly is illustrated, but the IC chip may be on the outside of the optical subassembly. In this case, the electric signal controller may be a circuit board (PCB) provided with the IC terminal group.

While there have been described what are at present considered to be certain embodiments of the invention, it will be understood that various modifications may be made thereto, and it is intended that the appended claims coverall such modifications as fall within the true spirit and scope of the invention.

What is claimed is:

1. An optical subassembly comprising:
a photodetector including a plurality of light-receiving elements and a plurality of element terminal groups which are respectively electrically connected to the plurality of light-receiving elements and are disposed to be aligned in order along a first direction; and
an electric signal controller including a plurality of IC terminal groups which are electrically connected to the plurality of element terminal groups and are disposed to be aligned in order along the first direction,
wherein the plurality of element terminal groups face the plurality of IC terminal groups while being separated from each other,
wherein any one of the element terminal group and the IC terminal group has a two-terminal configuration in which a first conductive type first connection terminal and a second conductive type second connection terminal are respectively disposed to be aligned along the first direction,
wherein the other one of the element terminal group and the IC terminal group has a three-terminal configuration in which a first conductive type third connection terminal and two second conductive type fourth connection terminals are disposed to be aligned along the first direction in order of one of the fourth connection terminals, the third connection terminal, and the other one of the fourth connection terminals, wherein each of the first connection terminals is electrically connected to the corresponding third connection terminal via a wire, and each of the second connection terminals is electrically connected to corresponding two fourth connection terminals via the wire, wherein, in the first direction, center positions of the element terminal groups at both ends among the plurality of element terminal groups are located together on the inner or outer side with respect to center positions of the IC terminal groups at both ends among the plurality of IC terminal groups, and wherein, in a case where the center positions of the terminal groups at both ends that are either terminal groups of the element terminal groups at both ends or the IC terminal groups at both ends and have the two-terminal configuration are located together on the inner side with respect to the center positions of the terminal groups at both ends that are the other terminal groups of the element terminal groups at both ends or the IC terminal groups at both ends, the first connection terminals at both ends are disposed on the outer side with respect to the second connection terminals at both ends, in a case where the center positions of the terminal groups at both ends that are either terminal groups of the element terminal groups at both ends or the IC terminal groups at both ends and have the two-terminal configuration are located together on the outer side with respect to the center positions of the terminal groups at both ends that are the other terminal groups of the element terminal groups at both ends or the IC terminal groups at both ends, the first connection terminals at both ends are disposed on the inner side with respect to the second connection terminals at both ends.

2. The optical subassembly according to claim 1, wherein, in a case where the center positions of the terminal groups at both ends that are either terminal groups of the element terminal groups at both ends or the IC terminal groups at both ends and have the two-terminal configuration are located together on the inner side with respect to the center positions of the terminal groups at both ends that are the other terminal groups of the element terminal groups at both ends or the IC terminal groups at both ends, a plurality sets of the first connection terminal and the second connection terminal are repeatedly disposed in order from both ends, in a case where the center positions of the terminal groups at both ends that are either terminal groups of the element terminal groups at both ends or the IC terminal groups at both ends and have the two-terminal configuration are located together on the outer side with respect to the center positions of the terminal groups at both ends that are the other terminal groups of the element terminal groups at both ends or the IC terminal groups at both ends, a plurality sets of the second connection terminal and the first connection terminal are repeatedly disposed in order from both ends.

3. The optical subassembly according to claim 1, wherein the photodetector further includes a carrier having an upper surface on which the plurality of element terminal groups are disposed and a front surface on which the plurality of light-receiving elements are disposed, wherein each of the light-receiving elements includes a first conductive type electrode and a second conductive type electrode, wherein, on the front surface of the carrier, the plurality of light-receiving elements are disposed to be aligned in a first direction, and the first conductive type electrode and the second conductive type electrode in each of the light-receiving elements are disposed to be aligned in a direction intersecting the first direction on the front surface of the carrier, and wherein, on the front surface of the carrier, a first connection wiring for electrically connecting the first conductive type electrode and the first connection terminal to each other, and a second connection wiring for electrically connecting the second conductive type electrode and the second connection terminal to each other, are disposed.

4. The optical subassembly according to claim 1, further comprising:

an IC chip which is electrically connected to the electric signal controller.

5. The optical subassembly according to claim 4, wherein the photodetector is an array type optical receiver module on which a plurality of photo diodes are disposed, and wherein the IC chip is provided with a preamplifier circuit which amplifies an electric signal output by each of the photo diodes.

6. The optical subassembly according to claim 1, wherein the photodetector is an array type semiconductor laser device.

7. An optical module comprising:

the optical subassembly according to claim 1;

a circuit board; and a case including the optical subassembly and the circuit board.

* * * * *